US012642036B2

(12) United States Patent
Choi et al.

(10) Patent No.: US 12,642,036 B2
(45) Date of Patent: May 26, 2026

(54) APPARATUS AND METHOD OF TREATING SUBSTRATE

(71) Applicant: SEMES CO., LTD., Cheonan-si (KR)

(72) Inventors: Jun Young Choi, Cheongju-si (KR); Yong Sun Ko, Suwon-si (KR); Jun Hyun Lim, Seoul (KR); Gui Su Park, Cheonan-si (KR); Young Jin Jang, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 710 days.

(21) Appl. No.: 17/960,392

(22) Filed: Oct. 5, 2022

(65) Prior Publication Data

US 2023/0110780 A1    Apr. 13, 2023

(30) Foreign Application Priority Data

Oct. 8, 2021    (KR) ........................ 10-2021-0133699

(51) Int. Cl.
*H10P 72/00*        (2026.01)
*H10P 72/30*        (2026.01)

(52) U.S. Cl.
CPC ...... *H10P 72/0416* (2026.01); *H10P 72/0404* (2026.01); *H10P 72/0408* (2026.01); *H10P 72/0414* (2026.01); *H10P 72/0426* (2026.01); *H10P 72/3302* (2026.01)

(58) Field of Classification Search
CPC ................................................ H01L 21/67057
See application file for complete search history.

(56) References Cited

U.S. PATENT DOCUMENTS

2010/0068014 A1*    3/2010    Mitsuyoshi ....... H01L 21/68707
                                                                            414/226.04

FOREIGN PATENT DOCUMENTS

| | | | |
|---|---|---|---|
| JP | S61-100937 | A | 5/1986 |
| JP | 2020-004916 | A | 1/2020 |
| KR | 100205238 | B1 | 7/1999 |
| KR | 100761576 | B1 | 9/2007 |
| KR | 101267929 | B1 | 5/2013 |
| KR | 10-2016-0015544 | A | 2/2016 |
| KR | 10-2017-0072808 | A | 6/2017 |
| KR | 10-2020-0068081 | A | 6/2020 |

(Continued)

OTHER PUBLICATIONS

Korean Office Action dated Apr. 21, 2024 issued in corresponding Korean Appln. No. 10-2023-0110452.

(Continued)

*Primary Examiner* — Jason Y Ko
(74) *Attorney, Agent, or Firm* — HARNESS, DICKEY & PIERCE, P.L.C.

(57)            ABSTRACT

The present invention provides an apparatus for treating a substrate, the apparatus including: a processing tank having an accommodation space in which a processing liquid is accommodated; a support member for supporting at least one substrate in the receiving space in a vertical posture; and a posture changing robot for changing a posture of the substrate in a state of being immersed in the liquid state from the vertical posture to a horizontal posture, in which wherein the posture changing robot includes: a hand configured to grip the substrate; and an arm for moving the hand.

20 Claims, 19 Drawing Sheets

(56)         References Cited

FOREIGN PATENT DOCUMENTS

KR      10-2023-0046370  A      4/2023
TW                I710017  B      11/2020

OTHER PUBLICATIONS

Korean Office Action dated Jun. 27, 2024 issued in corresponding
Korean Appln. No. 10-2024-0042443.
Korean Office Action dated Apr. 27, 2023 issued in corresponding
Korean Appln. No. 10-2021-0133699.
Chinese Office Action dated Dec. 20, 2025 issued in corresponding
CN Patent Application No. 202211236298.7.

* cited by examiner

APPARATUS AND METHOD OF TREATING SUBSTRATE

CROSS-REFERENCE TO RELATED APPLICATIONS

This application claims priority to and the benefit of Korean Patent Application No. 10-2021-0133699 filed in the Korean Intellectual Property Office on Oct. 8, 2021, the entire contents of which are incorporated herein by reference.

TECHNICAL FIELD

The present invention relates to an apparatus and method of treating a substrate.

BACKGROUND ART

In order to manufacture a semiconductor device, a desired pattern is formed on a substrate, such as a wafer, through various processes, such as photography, etching, ashing, ion implantation, and thin film deposition. Various processing liquids and processing gas are used in each process, and particles and process by-products are generated during the process. In order to remove the thin film, particles, and process by-products on the substrate from the substrate, a liquid processing process is performed on the substrate before and after each process. In a general liquid processing process, the substrate is treated with chemicals and a rinse liquid, followed by drying. In the liquid processing process, SiN on the substrate may be stripped.

In addition, the method of treating a substrate with a processing liquid, such as a chemical and/or a rinse liquid may be divided into a batch type treating method in which a plurality of substrates is treated in a batch, and a single-wafer type treating method in which the substrate is treated one by one.

In the batch type treating method for collectively treating a plurality of substrates, substrate treatment is performed by collectively immersing a plurality of substrates in a vertical posture in a processing tank in which a chemical or a rinse liquid is stored. For this reason, the mass productivity of the substrate treatment is excellent, and the process quality between the substrates is uniform. However, in the batch type treating method, a plurality of substrates having patterns formed thereon is immersed in a vertical posture. Accordingly, when the pattern formed on the substrate has a high aspect ratio, pattern leaning may occur in the pattern formed on the substrate in the process of lifting the substrate or the like. In addition, when the drying process is not performed within a short time in the state where the plurality of substrates is exposed to the air at once, there is concern that a water mark may be generated on some of the plurality of substrates exposed to the air.

On the other hand, in the case of the single-wafer type treating method in which the substrates are treated one by one, the substrate treatment is performed by supplying a chemical or a rinse liquid to a single substrate rotating in a horizontal posture. In addition, in the single-wafer type treating method, since the transferred substrate maintains a horizontal posture, the risk of the pattern leaning phenomenon described above is low, and the substrate is treated one by one and the treated substrate is immediately dried or the liquid processing is performed, so that the risk of occurrence of the above-described water mark is small. However, in the case of the single-wafer type treating method, the mass productivity of the substrate treatment is low, and the treatment quality between the substrates is relatively non-uniform when compared with the batch type treating method.

In addition, when the substrate is rotated and spin-dried, and when the pattern formed on the substrate has a high aspect ratio, there is concern that a leaning phenomenon in which the pattern formed on the substrate collapses occurs.

SUMMARY OF THE INVENTION

The present invention has been made in an effort to provide a substrate treating apparatus and method capable of efficiently processing a substrate.

The present invention has also been made in an effort to provide a substrate treating apparatus and method capable of improving the mass productivity of substrate treatment.

The present invention has also been made in an effort to provide a substrate treating apparatus and method capable of further increasing the uniformity of processing quality between respective substrates.

The present invention has also been made in an effort to provide a substrate treating apparatus and method capable of minimizing the risk of generating a watermark on a substrate.

The present invention has also been made in an effort to provide a substrate treating apparatus and method capable of minimizing the occurrence of a leaning phenomenon in a pattern formed on a substrate.

The present invention has also been made in an effort to provide a substrate treating apparatus and method capable of efficiently processing a substrate on which a pattern having a high aspect ratio is formed.

The problem to be solved by the present invention is not limited to the above-mentioned problems, and the problems not mentioned will be clearly understood by those skilled in the art from the descriptions below.

An exemplary embodiment of the present invention provides an apparatus for treating a substrate, the apparatus including: a processing tank having an accommodation space in which a processing liquid is accommodated; a support member for supporting at least one substrate in the receiving space in a vertical posture; and a posture changing robot for changing a posture of the substrate in a state of being immersed in the liquid state from the vertical posture to a horizontal posture, in which wherein the posture changing robot includes: a hand configured to grip the substrate; and an arm for moving the hand.

In the exemplary embodiment, the apparatus may further include a controller, in which the controller may control the posture changing robot to move the substrate along one direction while rotating the substrate about one axis when the posture of the substrate is changed.

In the exemplary embodiment, the controller may control the posture changing robot so that the hand moves linearly along the one direction while holding the substrate and rotating about the one axis when the posture of the substrate is changed.

In the exemplary embodiment, the controller may control the posture changing robot so that a difference between a time point at which the rotation of the substrate ends and a time point at which the movement of the substrate along the one direction ends is equal to or less than a set time.

In the exemplary embodiment, the controller may control the posture changing robot so that the time point at which the rotation of the substrate ends and a time point at which the position change of the substrate along the one direction ends are the same as each other.

In the exemplary embodiment, the hand may include: a support body for supporting the substrate; and a chucking body provided to be movable between a chucking position for chucking the substrate and a standby position farther from the substrate than the chucking position.

In the exemplary embodiment, the hand may further include a fastening body for fastening the support body and the chucking body to the arm.

In the exemplary embodiment, the hand may further include a vision member for photographing the substrate supported by the support body.

In the exemplary embodiment, the arm may be an articulated arm composed of at least two axes.

In the exemplary embodiment, the apparatus may further include a buffer unit for temporarily storing the substrate, in which the controller controls the posture changing robot to transfer the substrate of which the posture is changed from the vertical posture to the horizontal posture to the buffer unit.

In the exemplary embodiment, the posture changing robot may further include a wetting nozzle for supplying a wetting liquid for maintaining the wettability of the substrate placed on the hand.

In the exemplary embodiment, the wetting liquid may be a liquid of the same type as the processing liquid.

Another exemplary embodiment of the present invention provides an apparatus for treating a substrate, the apparatus including: a first process processing unit for processing a substrate in a batch manner; and a second process processing unit for processing the substrate in a single-wafer type, in which the first process processing unit includes: a posture change processing tank having an accommodation space in which a liquid is accommodated; a support member for supporting at least one substrate in the receiving space in a vertical posture; and a posture changing robot for changing a posture of the substrate in a state of being immersed in the liquid from the vertical posture to a horizontal posture, wherein the posture changing robot includes a hand and an arm that moves the hand.

In the exemplary embodiment, the apparatus may further include a controller, in which the controller may control the posture changing robot so that the posture changing robot completes the posture change of the substrate and transfers the substrate of which the posture has been changed to the second process processing unit.

In the exemplary embodiment, the second process processing unit may include a buffer unit for temporarily storing the substrate of which the posture has been changed, and the controller may control the posture changing robot so that the posture changing robot completes the posture change of the substrate and transfers the substrate of which the posture has been changed to the buffer unit.

In the exemplary embodiment, the accommodation space may have: a support region in which the support member supports the substrate; and a posture change region in which the posture changing robot changes the posture of the substrate.

In the exemplary embodiment, the posture changing robot may be disposed more adjacent to the posture change region between the support region and the posture change region.

In the exemplary embodiment, the first process processing unit may further include a batch processing tank for processing a plurality of substrates with a processing liquid, and when viewed from above, a width in one direction among widths of the batch processing tank may be smaller than a width in the one direction among widths of the posture change processing tank.

In the exemplary embodiment, the batch processing tank may be provided in plurality, and the first process processing unit may further include: a first transfer unit for transferring an unprocessed substrate to the batch processing tank; a second transfer unit for transferring the substrate between the batch processing tank and the posture change processing tank; and a batch transfer unit for transferring the substrate between the batch processing tanks.

Still another exemplary embodiment of the present invention provides an apparatus for treating a substrate, the apparatus including: a first process processing unit for processing a substrate in a batch manner; a second process processing unit for processing the substrate in a single-wafer type; and a controller, in which the first process processing unit includes: a batch processing tank for processing substrates in a vertical posture; a posture change processing tank for changing the substrate in the vertical posture to a horizontal posture, wherein the posture change processing tank has an accommodation space in which a liquid is accommodated, and a support member for supporting the substrate in the vertical posture is disposed in the accommodation space; and a posture changing robot for changing the posture of the substrate in a state of being immersed in the liquid from the vertical posture to the horizontal posture, wherein the posture changing robot includes a hand and an arm for moving the hand, and the second process processing unit includes: a buffer unit for providing a space for temporarily storing a substrate; a single-wafer type liquid processing chamber for liquid-processing the substrate by supplying a processing liquid to the rotating substrate; a single-wafer type drying chamber for drying the substrate by supplying a supercritical fluid to the substrate; and a transfer robot for transferring the substrate between the buffer unit and the single-wafer type liquid processing chamber, or between the buffer unit and the single-wafer type drying chamber, the controller controls the posture changing robot so that the substrate moves in a horizontal direction while rotating about one axis in a state of being immersed in the liquid accommodated in the accommodation space when the posture of the substrate is changed, and controls the posture changing robot so that the posture changing robot completes the posture change of the substrate and transfers the substrate of which the posture has been changed to the buffer unit.

Still another exemplary embodiment of the present invention provides a method of treating a substrate, the method comprising: a batch-type processing operation in which liquid processing is performed on a plurality of substrates in a vertical posture; a posture changing operation of changing a posture of the substrate from the vertical posture to a horizontal posture; and a single-wafer type processing operation of performing processing on the single substrate in the horizontal posture, in which the posture changing operation is performed while the substrate is immerged in a liquid.

In the exemplary embodiment, in the posture changing operation, the posture change of the substrate may be performed one by one.

In the exemplary embodiment, the posture changing operation may include moving the substrate in one direction while rotating the substrate about one axis.

In the exemplary embodiment, in the posture changing operation, the rotation of the substrate may be made in a direction in which one end of the substrate moves away from a hand of a robot that rotates the substrate.

In the exemplary embodiment, the method may further include a wetting operation of injecting a wetting liquid to the substrate, the wetting operation being performed between the posture changing operation and the single-wafer type processing operation.

In the exemplary embodiment, the wetting operation may be performed by injecting the wetting liquid from a wetting nozzle installed in a posture changing robot that changes the posture of the substrate.

In the exemplary embodiment, the wetting operation may be performed by injecting the wetting liquid from a wetting nozzle installed in a buffer unit for temporarily storing the substrate.

In the exemplary embodiment, the batch type processing operation includes a pre-treatment and a post-treatment performed after the pre-treatment, and a type of a chemical used in the pre-treatment and a type of a chemical used in the post-treatment may be different from each other.

In the exemplary embodiment, at the time of the pre-treatment, the plurality of substrates may be treated with a first chemical liquid, thereafter, the plurality of the substrates may be treated with a second chemical liquid different from the first chemical liquid, in the post-processing, the plurality of substrates may be treated with the first chemical liquid and the second chemical liquid different from the first chemical liquid and the second chemical liquid, and thereafter, the plurality of substrates may be treated with a rinse liquid.

In the exemplary embodiment, the rinse liquid and the liquid in which the substrate is immersed in the posture changing operation may be the same type of liquid.

Yet another exemplary embodiment of the present invention provides a method of treating a substrate, the method including: a substrate loading operation of loading an unprocessed substrate into a first load port unit; a first posture changing operation of changing a posture of a plurality of substrates to a vertical posture at once; a batch type processing operation of performing liquid processing on the plurality of substrates in the vertical posture after the first posture change operation; and a second posture changing operation of changing the posture of the substrate from the vertical posture to a horizontal posture, in which the second posture changing operation may be performed while the substrate is immersed in a processing liquid.

In the exemplary embodiment, in the second posture changing operation, the posture change of the substrate may be performed one by one.

In the exemplary embodiment, the second posture changing operation may include moving the substrate in one direction while rotating the substrate about one axis.

In the exemplary embodiment, in the second posture changing operation, the rotation of the substrate and the movement of the substrate may be terminated at the same time point.

In the exemplary embodiment, the method may further include a single-wafer type processing operation in which the single substrate in the horizontal posture is processed, the single-wafer type processing operation being performed after the second posture changing operation.

In the exemplary embodiment, the single-wafer processing operation may include a liquid processing operation of liquid-treating the substrate in a single-wafer manner; and a drying operation of drying the substrate in a single-wafer manner.

In the exemplary embodiment, the liquid processing operation may be performed by rotating the substrate and supplying a processing liquid to the rotating substrate, and the drying operation may be performed by supplying a supercritical fluid to the substrate.

In the exemplary embodiment, the liquid processing operation may be performed between the second posture changing operation and the single-wafer type processing operation, and a wetting liquid may be supplied to the substrate of which the posture has been changed to the horizontal posture.

According to the embodiment, the wetting liquid and the processing liquid in which the substrate is immersed in the second posture changing operation may be the same type of liquid.

Still yet another exemplary embodiment of the present invention provides a method of treating a substrate, the method including: a substrate loading operation of loading a substrate in an unprocessed state into a first load port unit; a first posture changing operation of changing a posture of the substrate loaded into the first load port unit from a horizontal posture to a vertical posture, wherein in the first posture changing operation, the posture of a plurality of the substrates is changed at once; a batch type processing operation in which liquid processing is performed on the plurality of substrates in the vertical posture; a second posture changing operation of changing the posture of the substrate on which the batch type processing operation has been performed from the vertical posture to the horizontal posture, wherein the second posture changing operation is performed in a state in which the substrate is immerged in water accommodated in a posture change processing treatment tank; a wetting operation of supplying water to the substrate on which the second posture changing operation has been performed; a single-wafer type processing operation of supplying a supercritical fluid to the substrate on which the wetting operation has been performed to perform drying processing; and a substrate unloading operation of transferring the processed substrate to a second load port unit that is different from the first load port unit after the single-wafer type processing operation is performed.

According to the exemplary embodiment of the present invention, it is possible to efficiently treat a substrate.

Further, according to the exemplary embodiment of the present invention, it is possible to improve mass productivity of substrate treatment.

Further, according to the exemplary embodiment of the present invention, it is possible to further improve the uniformity of the processing quality between respective substrates.

In addition, according to the exemplary embodiment of the present invention, it is possible to minimize the risk that a water mark is generated on the substrate.

In addition, according to the exemplary embodiment of the present invention, it is possible to minimize the occurrence of a leaning phenomenon in the pattern formed on the substrate.

In addition, according to the exemplary embodiment of the present invention, it is possible to efficiently treat a substrate on which a pattern having a high aspect ratio is formed.

The effect of the present invention is not limited to the foregoing effects, and non-mentioned effects will be clearly understood by those skilled in the art from the present specification and the accompanying drawings.

BRIEF DESCRIPTION OF THE DRAWINGS

Figure 1:
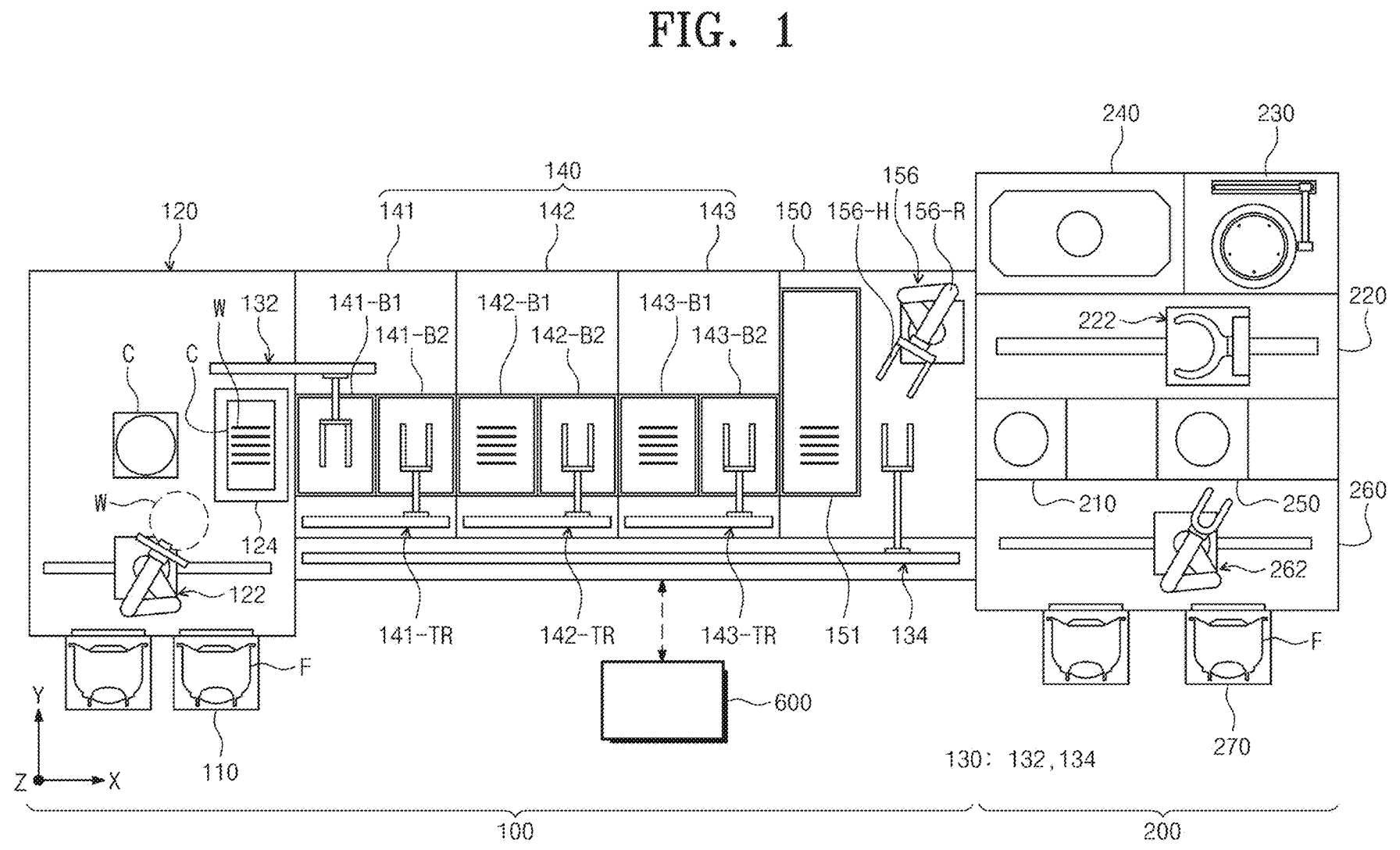

FIG. 1 is a schematic view of a substrate treating apparatus according to an exemplary embodiment of the present invention when viewed from above.

FIGS. 10 and 11 are diagrams illustrating a state in which a posture changing robot changes a posture of a substrate to a horizontal posture in a second posture changing operation of FIG. 9.

DETAILED DESCRIPTION

Figure 2:
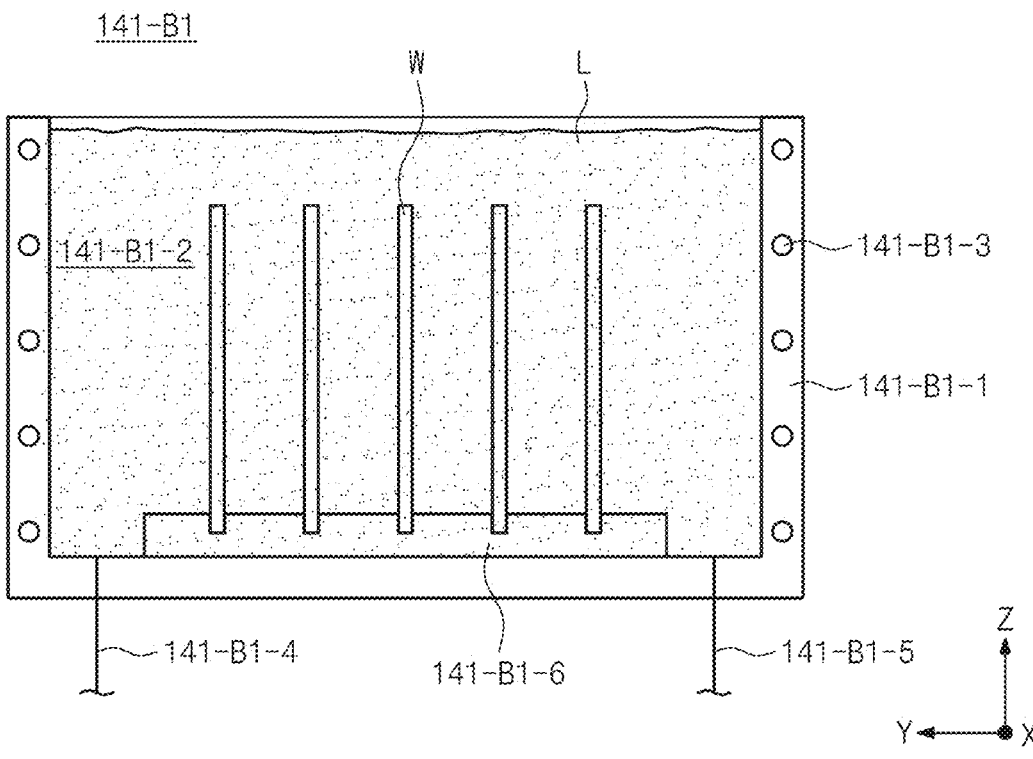
FIG. 2 is a diagram illustrating a state of one of batch processing tanks of FIG. 1.

Hereinafter, an exemplary embodiment of the present invention will be described more fully hereinafter with reference to the accompanying drawings, in which exemplary embodiments of the invention are illustrated. However, the present invention can be variously implemented and is not limited to the following exemplary embodiments. In the following description of the present invention, a detailed description of known functions and configurations incorporated herein is omitted to avoid making the subject matter of the present invention unclear. In addition, the same reference numerals are used throughout the drawings for parts having similar functions and actions.

Unless explicitly described to the contrary, the word "comprise" and variations such as "comprises" or "comprising" will be understood to imply the inclusion of stated elements but not the exclusion of any other elements. It will be appreciated that terms "including" and "having" are intended to designate the existence of characteristics, numbers, operations, operations, constituent elements, and components described in the specification or a combination thereof, and do not exclude a possibility of the existence or addition of one or more other characteristics, numbers, operations, operations, constituent elements, and components, or a combination thereof in advance.

Singular expressions used herein include plurals expressions unless they have definitely opposite meanings in the context. Accordingly, shapes, sizes, and the like of the elements in the drawing may be exaggerated for clearer description.

Terms, such as first and second, are used for describing various constituent elements, but the constituent elements are not limited by the terms. The terms are used only to discriminate one constituent element from another constituent element. For example, without departing from the scope of the invention, a first constituent element may be named as a second constituent element, and similarly a second constituent element may be named as a first constituent element.

It should be understood that when one constituent element referred to as being "coupled to" or "connected to" another constituent element, one constituent element can be directly coupled to or connected to the other constituent element, but intervening elements may also be present. In contrast, when one constituent element is "directly coupled to" or "directly connected to" another constituent element, it should be understood that there are no intervening element present. Other expressions describing the relationship between the constituent elements, such as "between" and "just between" or "adjacent to ~" and "directly adjacent to ~" should be interpreted similarly.

All terms used herein including technical or scientific terms have the same meanings as meanings which are generally understood by those skilled in the art unless they are differently defined. Terms defined in generally used dictionary shall be construed that they have meanings matching those in the context of a related art, and shall not be construed in ideal or excessively formal meanings unless they are clearly defined in the present application.

In addition, components that transfer a substrate W described below, for example, the transfer units or transfer robots, may be referred to as transfer modules.

Hereinafter, exemplary embodiments of the present invention will be described with reference to FIGS. 1 to 19.

FIG. 1 is a schematic view of a substrate treating apparatus according to an exemplary embodiment of the present invention when viewed from above.

Referring to FIG. 1, a substrate treating apparatus 10 according to an exemplary embodiment may include a first process processing unit 100, a second process processing unit 200, and a controller 600. The first process processing unit 100 and the second process processing unit 200 may be arranged along a first direction X when viewed from above. Hereinafter, when viewed from above, a direction perpendicular to the first direction X is referred to as a second direction Y, and a direction perpendicular to the first direction X and the second direction Y is referred to as a third direction Z.

The first process processing unit 100 may collectively process a plurality of substrates W with a liquid in a batch manner. For example, the first process processing unit 100 may collectively clean the plurality of substrates W in a batch manner. The first process processing unit 100 may simultaneously process the plurality of substrates W in a vertical posture (a posture in which the upper surface or lower surface of the substrate W is parallel to a direction perpendicular to the ground).

The first process processing unit 100 may include a first load port unit 110, an index chamber 120, a transfer unit 130, a batch type processing unit 140, and a posture changing part 150.

The first load port unit 110 may include at least one or more load ports. A transfer container F in which at least one substrate W is accommodated may be placed in the load ports of the first load port unit 110. The plurality of substrates W may be accommodated in the transfer container F. For example, 25 substrates may be accommodated in the transfer container F. The transfer container F may be referred to as a cassette, a pod, or a FOUP. The transfer container F may be loaded to the first load port unit 110 by a container transfer device. The substrates W accommodated in the transfer container F placed on the first load port unit 110 may be unprocessed substrates W. The unprocessed substrates W may be, for example, substrates W on which no processing has been performed, or substrates W on which liquid processing is required although some processing has been performed.

In addition, only the container F in which the unprocessed substrate W is accommodated may be placed in the first load port unit 110. That is, the first load port unit 110 may perform only the role of loading the substrate W required to be processed.

The first load port unit 110 may be coupled to the index chamber 120. The index chamber 120 and the first load port unit 110 may be arranged in the second direction Y. The first index chamber 120 may include an index robot 122 and a posture changing unit 124. The index robot 122 may take out the unprocessed substrate W or the substrate W required to be processed from the container F seated on the first load port unit 110. The first transfer robot 122 may take out the substrate W from the container F and load the substrate W into an accommodation container C provided in the first index chamber 120. The first transfer robot 122 may have a placement hand capable of holding and transferring a plurality of (for example, 25) substrates W at the same time.

The accommodation container C may have a substantially cylindrical shape. The accommodation container C may have an accommodation space therein. A plurality of substrates W may be accommodated in the accommodation space of the accommodation container C. For example, 50 substrates W may be accommodated in the accommodation space of the accommodation container C. The accommodation container C may have a cylindrical shape in which at least two or more of the surfaces of the accommodation container C are open. A support member for supporting/holding the substrate W may be provided in the accommodation space of the accommodation container C.

When the loading of the substrate W loaded out from the transfer container F into the accommodation container C is completed, the accommodation container C may be transferred to the posture changing unit 124 disposed in the index chamber 120 by a transfer means (not illustrated). The posture changing unit 124 may rotate the accommodation container C. For example, the posture changing unit 124 may rotate the accommodation container C so that the opened portion of the accommodation container C faces the top. When the open portion of the accommodation container C is rotated to face the top, the posture of the substrate W accommodated in the accommodation container C may be changed from a horizontal posture (a posture in which the upper and lower surfaces of the substrate W are horizontal to the ground) to the vertical posture. The horizontal posture may mean a state in which the upper surface of the substrate W (for example, the surface on which the pattern is formed) is parallel to the X-Y plane (that is, the ground), and the vertical posture may mean a state in which the upper surface of the substrate W is parallel to the X-Z plane or the Y-Z plane (that is, a plane perpendicular to the ground).

The transfer unit 130 may include a first transfer unit 132 for transferring the substrate W between the index chamber 120 and the batch type processing unit 140, and a second transfer unit 134 for transferring the substrate W between the batch type processing unit 140 and the posture changing part 150 to be described later.

The first transfer unit 132 may include a rail extending along the first direction X and a hand configured to transfer a plurality of substrates W at once. The first transfer unit 132 may hold the substrates W of which the postures are changed by the posture changing unit 124, and transfer the held substrates W to the batch type processing unit 140. For example, the first transfer unit 132 may transfer the substrates W of which the postures are changed by the posture changing unit 124 to any one selected from among the batch processing tanks 141-B1 to 143-B2 of the batch type processing unit 140. For example, the first transfer unit 132 may transfer the substrates W of which the postures are changed by the posture changing unit 124 to the first-1 batch processing tank 141-B1.

The second transfer unit 134 may include a rail extending along the first direction X and a hand configured to transfer a plurality of substrates W at once. The second transfer unit 134 may be configured to transfer the substrate W between a first batch type processing unit 141, a second batch type processing unit 142, and a third batch type processing unit 143 of the batch type processing unit 140 of the batch type processing unit 140. Also, the second transfer unit 134 may be configured to transfer the substrate W between the batch type processing unit 14 and the posture changing unit 150.

In addition, the substrates W of which the postures are changed by the posture changing unit 124 and accommodated in the accommodation container C and the substrates W accommodated in the batch processing tank of the batch type processing unit 140 may be arranged side by side in the first direction X when viewed from above.

In addition, the substrates W accommodated in the batch processing tanks 141-B1 to 143-B2 of the batch type processing unit 140 and the substrates W accommodated in a posture change processing tank 151 of the posture changing unit 150 may be arranged side by side in the first direction X when viewed from above. In addition, the substrates W accommodated in the batch processing tanks 141-B1 to 143-B2 of the batch type processing unit 140 may be arranged side by side in the first direction X when viewed from above. That is, a support member 141-B1-6 of each of the batch processing tanks 141-B1 to 143-B2 and the support member 153 of the posture change processing tank 151 may be arranged side by side in the first direction X when viewed from above.

The batch type processing unit 140 may liquid-process the plurality of substrates W at once. The batch type processing unit 140 may wash the plurality of substrates W at once by using a processing liquid. The batch type processing unit 140 may liquid-process the plurality of substrates W at once by using a processing liquid. The processing liquid used in the batch type processing unit 140 may be a chemical and/or a rinse liquid. For example, the chemical may be a chemical having a property of a strong acid or a strong base. In addition, the rinse liquid may be pure. For example, the chemical may be appropriately selected from a chemical removing Ammonia-Hydrogen Peroxide Mixture (APM), Hydrochloricacid-Hydrogen Peroxide Mixture (HPM), Hydrofluoricacid-Hydrogen Peroxide Mixture (FPM), Diluted Hydrofluoric acid (DHF), Diluted Sulfuric acid Peroxide (DSP), or SiN, a chemical containing phosphoric acid, a chemical containing sulfuric acid, and the like. The rinse liquid may be a liquid containing water. For example, the rinse liquid may be appropriately selected from pure water or ozone water.

The batch type processing unit 140 may include the first batch type processing unit 141, the second batch type processing unit 142, and the third batch type processing unit 143.

The first batch type processing unit 141 may include a first-1 batch processing tank 141-B1, a first-2 batch processing tank 141-B2, and a first batch transfer unit 141-TR.

In the 1-1 batch processing tank 141-B1, the plurality of substrates W may be liquid-processed simultaneously with a chemical, such as DSP. In the first-2 batch processing tank 141-B2, the plurality of substrates W may be treated simultaneously with a chemical, such as DHF. However, the present invention is not limited thereto, and the processing liquid used in the first-1 batch processing tank 141-B1 and the first-2 batch processing tank 141-B2 may be variously changed to the processing liquid selected from among the processing liquids described above.

The first batch transfer unit 141-TR may be configured to transfer the substrate W between the first-1 batch processing tank 141-B1 and the first-2 batch processing tank 141-B2.

The second batch type processing unit 142 may include a second-1 batch processing tank 142-B1, a second-2 batch processing tank 142-B2, and a second batch transfer unit 142-TR.

In the second-1 batch processing tank 142-B1, the plurality of substrates W may be treated simultaneously with a chemical containing phosphoric acid. In the second-2 batch processing tank 142-B2, the plurality of substrates W may be simultaneously treated with the rinse liquid. However, the present invention is not limited thereto, and the processing liquid used in the second-1 batch processing tank 142-B1 and the second-2 batch processing tank 142-B2 may be variously changed to the processing liquid selected from among the processing liquids described above.

The second batch transfer unit 142-TR may be configured to transfer the substrate W between the second-1 batch processing tank 142-B1 and the second-2 batch processing tank 142-B2.

The third batch type processing unit 143 may include a third-1 batch processing tank 143-B1, a third-2 batch processing tank 142-B2, and a third batch transfer unit 143-TR.

In the third-1 batch processing tank 143-B1, the plurality of substrates W may be treated simultaneously with a chemical containing phosphoric acid. In the third-2 batch processing tank 143-B2, the plurality of substrates W may be simultaneously treated with the rinse liquid. However, the present invention is not limited thereto, and the processing liquid used in the third-1 batch processing tank 143-B1 and the third-2 batch processing tank 143-B2 may be variously changed to the processing liquid selected from among the processing liquids described above.

The third batch transfer unit 143-TR may be configured to transfer the substrate W between the third-1 batch processing tank 143-B1 and the third-2 batch processing tank 143-B2.

Since the batch processing tanks 141-B1 to 143-B2 have the same or similar structure to each other except for the type of the processing liquid L used, so that hereinafter, the first-1 batch processing tank 141-B1 will be described, and repeated descriptions of the remaining batch processing tanks 141-B2 to 143-B2 will be omitted.

FIG. 2 is a view illustrating a state of one of the batch processing tanks of FIG. 1. For example, in FIG. 2, the first-1 batch processing tank 141-B1 among the batch processing tanks 141-B1 to 143-B2 is illustrated.

Referring to FIG. 2, the first-1 batch processing tank 141-B1 may include a processing tank 141-B1-1, a heating member 141-B1-3, a supply line 141-B1-4, a recovery line 141-B1-5, and a support member 141-B1-6.

The processing tank 141-B1-1 may have an accommodation space 141-B1-2 therein. The processing tank 141-B1-1 may have a cylindrical shape with an open top. The processing liquid L may be accommodated (stored) in the accommodation space 141-B1-2 of the processing tank 141-B1-1. In order to adjust the temperature of the processing liquid L stored in the accommodation space 141-B1-2, a heating member 141-B1-3 may be installed in the processing tank 141-B1-1. The heating member 141-B1-3 may heat a temperature of the processing liquid L stored in the accommodation space 141-B1-2 of the processing tank 141-B1-1 to a preset temperature based on the temperature of the processing liquid L sensed by a temperature sensor (not illustrated).

The supply line 141-B1-4 may supply the processing liquid L to the accommodation space 141-B1-2. The recovery line 141-B1-5 may drain the processing liquid L from the accommodation space 141-B1-2. A valve is installed in each of the supply line 141-B1-4 and the recovery line 141-B1-5, and the liquid level of the processing liquid L supplied to the accommodation space 141-B1-2 (that is, the amount of processing liquid L stored in the accommodation space 141-B1-2) may be adjusted to a set level.

The support member 141-B1-6 may be disposed in the accommodation space 141-B1-2 to support the substrate W. The support members 141-B1-6 may be configured to support the plurality of substrates W. For example, the support members 141-B1-6 may be configured to support the 50 substrates W. The support member 141-B1-6 may be configured such that a pair of rod-shaped bodies is disposed to face each other, and a support recess (not illustrated) in which the substrate W is supportable is formed in each body.

Referring back to FIG. 1, the posture changing unit 150 may change the posture of the substrate W. The posture changing unit 150 may change the vertical posture of the substrate W to a horizontal posture. The posture changing unit 150 may change the posture of the substrate W so that the substrate W processed in the vertical position in the batch type processing unit 140 may be post-processed in the single-wafer processing chambers 230 and 240 that process the single substrate W in the horizontal position. The posture changing unit 150 may be disposed between the batch type processing unit 140 and the second process processing unit 200.

The posture changing unit 150 may include the posture change processing tank 151 and a posture changing robot 156. The posture change processing tank 151 may have a greater width than those of the batch processing tanks 141-B1 and 143-B2 when viewed from above. For example, when viewed from above, the posture change processing tank 151 may have a greater width in the second direction Y (one direction) than those of the batch processing tanks 141-B1 to 143-B2. Also, the posture change processing tank 151 may have the same width in the first direction X (the other direction) as those of the batch processing tanks 141-B1 to 143-B2 when viewed from above.

Figure 3:
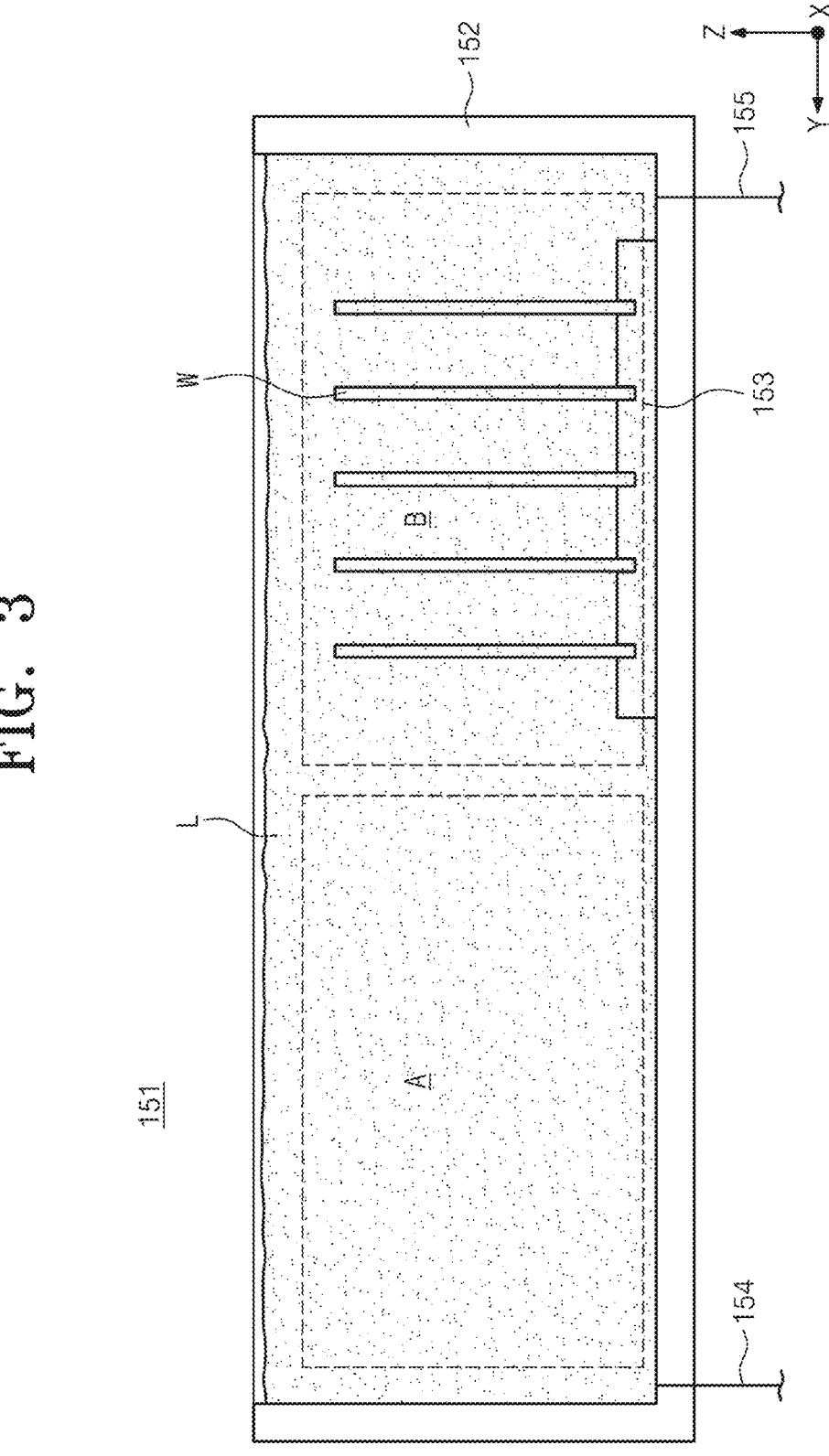
FIG. 3 is a diagram illustrating a state of a posture change processing tank of FIG. 1.

FIG. 3 is a diagram illustrating a state of the posture change processing tank of FIG. 1.

Referring to FIG. 3, the posture change processing tank 151 may include a processing tank 152, a support member 153, a supply line 154, and a recovery line 155.

The processing tank 152 may have a cylindrical shape with an open top. The processing tank 152 may have a rectangular tubular shape with an open top. The processing tank 152 may have accommodation spaces A and B in which the processing liquid L may be accommodated (stored) therein. The processing liquid L stored in the processing tank 152 may be a liquid containing water. The type of the processing liquid L stored in the processing tank 152 may be the same type of liquid as the wetting liquid injected from a first buffer unit 210 to be described later. For example, both the processing liquid L stored in the processing tank 152 and the wetting liquid injected from the first buffer unit 210 may be liquids including water.

The support member 153 may be disposed in the accommodation spaces A and B to support the substrate W. The support members A and B may be configured to support the plurality of substrates W. For example, the support member 153 may be configured to support 50 substrates W. The support member 153 may be configured such that a pair of rod-shaped bodies is disposed to face each other, and a support recess (not illustrated) in which the substrate W is supportable is formed in each body.

The supply line 154 may supply the processing liquid L to the accommodation spaces A and B. The recovery line 155 may drain the processing liquid L from the accommodation spaces A and B. A valve is installed in each of the supply line 154 and the recovery line 155, and based on the liquid level of the processing liquid L sensed by the liquid level sensor (not illustrated), the liquid level of the processing liquid L supplied to the accommodation spaces A and B (that is, the amount of processing liquid L stored in the accommodation spaces A and B) may be adjusted to a set level.

In addition, the accommodation spaces A and B may include a support area A and a posture change area B. The support area A may be an area in which the support member 153 supports the substrate W. The posture change area B may be an area in which the posture of the substrate W is changed by the posture changing robot 156 to be described later.

Referring back to FIG. 1, the posture changing robot 156 may be disposed on one side of the posture change processing tank 151. The posture changing robot 156 may be disposed between the posture change processing tank 151 and the first buffer unit 210 to be described later. The posture changing robot 156 may include a hand 156-H and a joint part 156-R. The hand 156-H may be coupled to the joint part 156-R. The joint part 156-R may change the position of the hand 156-H.

Figure 4:
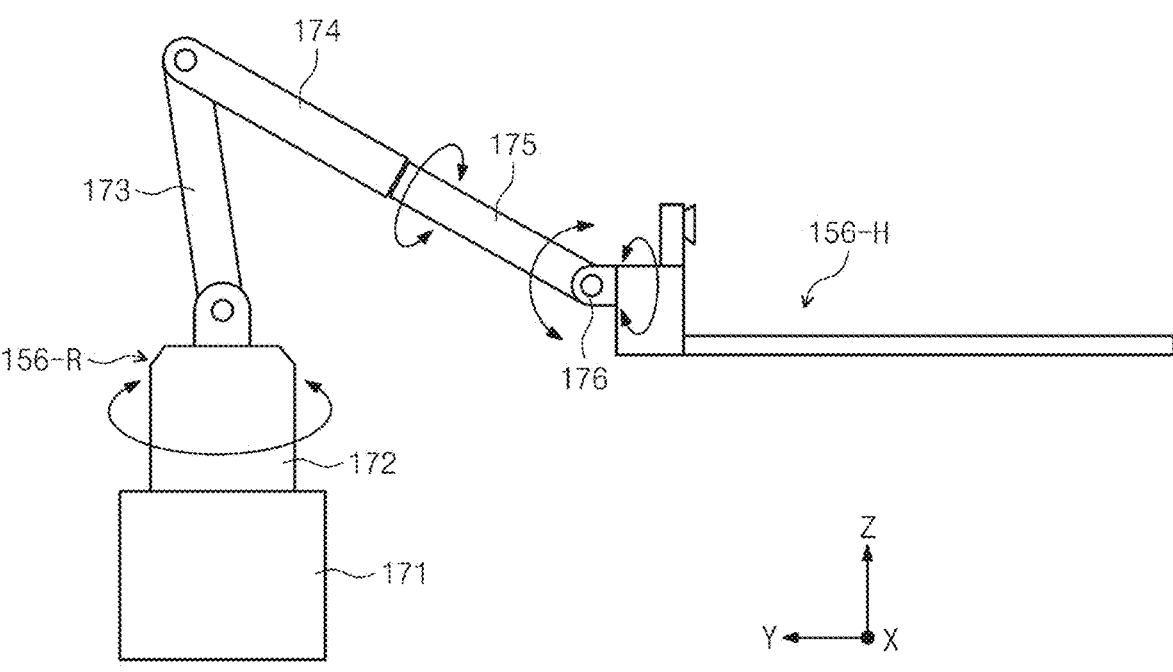
FIG. 4 is a diagram schematically illustrating a state of a posture changing robot of FIG. 1.

FIG. 4 is a diagram schematically illustrating a state of the posture changing robot of FIG. 1. Referring to FIG. 4, the posture changing robot 156 according to the exemplary embodiment of the present invention may change the posture of the substrate W from the vertical posture to the horizontal posture in the posture change processing tank 151, and transfer the substrate W of which the posture is changed to the horizontal posture to the first buffer unit 210 of the second process processing unit 200. Also, the posture changing robot 156 may be a multi-joint robot. The posture changing robot 156 may be a 6-axis articulated robot.

The joint part 156-R may be a multi-joint arm configured with at least two or more axes. For example, the joint part 156-R may be a six-axis articulated arm. The joint part 156-R may change the position of the hand 156-H by moving the hand 156-H along at least one of the first direction X, the second direction Y, and the third direction Z. In addition, the joint part 156-R rotate the hand 156-H based on the axis in one of the first direction X, the second direction Y, and the third direction Z.

The posture changing robot 156 may include a base 171, a rotating body 172, a first arm 173, a second arm 174, a third arm 175, and a fourth arm 176.

The base 171 may be coupled to the rotating body 172. The rotating body 172 may rotate based on the base 171. The rotating body 172 may be rotated in a direction perpendicular to the ground as a rotation axis. The first arm 173 may be coupled to the rotating body 172. The first arm 173 may be rotated with respect to the rotating body in the horizontal direction as a rotation axis. The second arm 174 may be coupled to the first arm 173. The second arm 174 may be rotated with respect to the first arm 173 in the horizontal direction as a rotation axis. The third arm 175 may be coupled to the second arm 174. The third arm 175 may be rotated using the longitudinal direction of the second arm 174 (or the longitudinal direction of the third arm 175) as a rotation axis. The fourth arm 176 may be rotated using a direction perpendicular to the longitudinal direction of the third arm 175 as a rotation axis. Also, the fourth arm 176 may rotate the hand 156-H. For example, the fourth arm 176 may include a rotating shaft (not illustrated) capable of rotating the hand 156-H. The hand 156-H may be rotated using a direction perpendicular to the rotation axis of the fourth arm 176 as a rotation axis.

Figure 5:
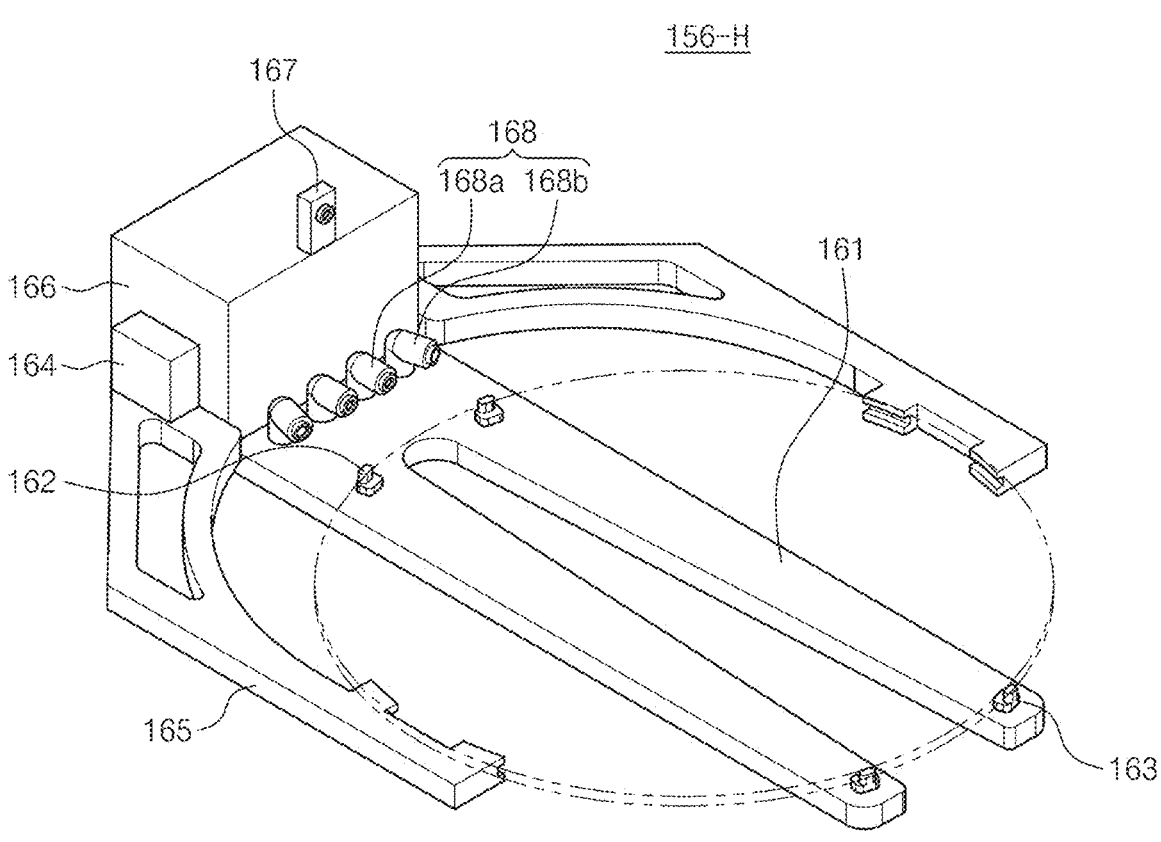
FIG. 5 is a diagram illustrating a hand of FIG. 4.

FIG. 5 is a diagram illustrating the hand of FIG. 4. Referring to FIG. 5, the hand 156-H of the posture changing robot 156 may include a support body 161, a first guide part 162, a second guide part 163, a driving member 164, a chucking body 165, a fastening body 166, a vision member 167, and a liquid supply member 168.

The support body 161 may support a lower surface of the substrate W. The support body 161 may support the lower surface of the substrate W between an upper surface on which the pattern is formed and the lower surface on which the pattern is not formed. That is, the substrate W may be placed on the support body 161.

The support body 161 may be provided with the first guide part 162 and the second guide part 163. The first guide part 162 may be a support pad adjacent to the fastening body 166 to be described later. The second guide part 163 may be a support pad far from the fastening body 166 to be described later. The first guide part 162 and the second guide part 163 may be provided as a pair. The first guide part 162 and the second guide part 163 may support the lower surface and/or the side surface of the substrate W. The upper surfaces of the first guide part 162 and the second guide part 163 may have a stepped shape. For example, the height of the inner region, which supports the lower surface of the substrate W, in the upper surface of the first guide part 162 may be lower than the height of the outer region, which does not support the lower surface of the substrate W. Similarly, the height of the inner region, which supports the lower surface of the substrate W, in the upper surface of the second guide part 163 may be lower than the height of the outer region which does not support the lower surface of the substrate W. That is, the substrate W may be placed on the support body 161 via the first guide part 162 and the second guide part 163 installed on the support body 161. Placing the substrate W on the support body 161 means the case where the support body 161 and the substrate W are in direct contact with each other as well as the case where the substrate is placed on the first guide part 162 and the second guide part 163 installed in the support body 161.

The driving member 164 may be fastened to the fastening body 166. The driving member 164 may be a driver capable of moving the chucking body 165 laterally. The driving member 164 may be provided as a pair. For example, the driving member 164 may be provided to correspond to each of the chucking bodies 165 provided as a pair. The pair of driving members 164 may move the pair of chucking bodies 165 in the lateral direction. The chucking bodies 165 may move in a direction closer to the side of the substrate W and a direction away from the side of the substrate W. Accordingly, the chucking body 165 may chuck the substrate W placed on the support body 161. In other words, the support body 161 and the chucking body 165 may be a body that grips the substrate W.

The fastening body 166 may be a body coupling the chucking body 165 and the support body 161 to the joint part 156-R. The fastening body 166 may be a body coupling the chucking body 165 and the support body 161 to the fourth arm 176 of the joint part 156-R. The fastening body 166 may be fastened to the rotation shaft of the fourth arm 176 of the joint part 156-R.

The first guide part 162 and the second guide part 163 may be provided in each of the support bodies 161. The first guide part 162 may be a protrusion adjacent to the fastening body 166 to be described later. The second guide part 163 may be a protrusion relatively far from the fastening body 166, which will be described later. The second guide part 163 may be disposed farther from the rotation member 166 than the first guide part 162. The first guide part 162 and the second guide part 163 may support the side of the substrate W. The first guide part 162 and the second guide part 163 support the side of the substrate W, and a gap between the first guide part 162 and the second guide part 1263 may be slightly smaller than a diameter of the substrate W.

The vision member 167 may acquire an image by photographing the substrate W and/or the support body 161. The acquired image may be transmitted to the controller 600, which will be described later. The controller 600 may generate a control signal for controlling the driving of the posture changing robot 156 based on the image acquired by the vision member 167.

The liquid supply member 168 may supply a wetting liquid WL to the substrate W placed on the support body 161. The wetting liquid WL may include water. The wetting liquid WL supplied by the liquid supply member 168 may be the same type of liquid as the processing liquid L stored in the accommodation spaces A and B. Also, the wetting liquid WL supplied by the liquid supply member 168 may be the same type of the wetting liquid WL supplied by the first buffer unit 210 to be described later.

The liquid supply member 168 may include a first nozzle 168a and a second nozzle 168b. At least one of each of the first nozzle 168a and the second nozzle 168b may be provided. Each of the first nozzle 168a and the second nozzle 168b may be provided in plurality. The first nozzle 168a may supply the wetting liquid WL to a first region of the substrate W placed on the support body 161. The second nozzle 168b may supply the wetting liquid WL to a second region of the substrate W placed on the support body 161. The first region and the second region may be different regions. The first region and the second region may be edge regions of the substrate W, as will be described later. The first region may be adjacent to the first nozzle 168a, and the second region may be adjacent to the second nozzle 168b.

The distance between the first region and the first nozzle 168a may be shorter than the distance between the second region and the second nozzle 168b. That is, the injection distance of the wetting liquid WL supplied from the first nozzle 168a may be different from the injection distance of the wetting liquid WL supplied from the second nozzle 168b. For example, the injection distance of the wetting liquid WL supplied from the first nozzle 168a may be shorter than the injection distance of the wetting liquid WL supplied from the second nozzle 168b.

Also, when viewed from above, the first nozzles 168a may be disposed between the second nozzles 168b. The second nozzles 168b may be disposed at a position relatively close to the chucking body 165, that is, the outer side. The first nozzles 168a may be disposed relatively far from the chucking body 165, that is, the inner side.

The injection directions of the wetting liquid WL of the first nozzle 168a and the second nozzle 168b may be different from each other. For example, when viewed from above, based on a virtual reference line passing through the center of the substrate W and the center of the vision member 167, the first nozzle 168a may supply the wetting liquid WL in a direction parallel to this reference line, and the second nozzle 168b may supply the wetting liquid WL in a direction inclined to the reference line.

The diameters of the injection holes of the first nozzle 168a and the second nozzle 168b may be different from each other. For example, the diameter of the injection hole of the first nozzle 168a may be greater than that of the injection hole of the second nozzle 168a. For example, the supply flow rates per unit time of the wetting liquid WL delivered to the first nozzle 168a and the second nozzle 168b may be the same. Accordingly, the injection distance of the wetting liquid WL injected from the first nozzle 168a may be shorter than the injection distance of the wetting liquid WL injected from the second nozzle 168b.

Also, the first nozzle 168a and the second body 168b may be installed on the support body 161.

Referring back to FIG. 1, the second process processing unit 200 may process the substrate W processed by the first process processing unit 100. The second process processing unit 200 may process the substrate W processed by the first process processing unit 100, and may liquid-process or dry the substrate W in a single-wafer type.

The second process processing unit 200 may include the first buffer unit 210, a first transfer chamber 220, a single-wafer type liquid processing chamber 230, a drying chamber 240, a second buffer unit 250, and a second transfer chamber 260, and a second load port unit 270. Both the single-wafer type liquid processing chamber 230 and the drying chamber 240 may be referred to as single-wafer processing chambers.

The first buffer unit 210 may provide a storage space for temporarily storing the substrate W. The first buffer unit 210 may be opened toward the posture changing unit 150 when viewed from above. The first buffer unit 210 may be opened toward the first transfer chamber 220 when viewed from above. Accordingly, the posture changing robot 156 may change the posture of the substrate W in the posture change processing tank 151 and transfer the substrate W of which the posture is changed to the first buffer unit 210. In addition, the substrate W transferred to the first buffer unit 210 may be unloaded by the first transfer robot 222 of the first transfer chamber 220. The unloaded substrate W may be transferred to the single-wafer type liquid processing chamber 230 or the single-wafer type drying chamber 240.

In addition, the first buffer unit 210 may be disposed at a relatively higher height than the above-described posture change processing tank 151. For example, when the posture change processing tank 151 is arranged on the first floor, the first buffer unit 210 may be arranged at a height corresponding to two floors or about 1.5 floors.

If necessary, the first buffer unit 210 may be disposed to be stacked with at least some of the single-wafer processing chambers. For example, the drying chamber 240 or the single-wafer type liquid processing chamber 230 to be described later may be disposed under the first buffer unit 210. For example, the single-wafer type liquid processing chamber 230 to be described later may be disposed under the first buffer unit 210. There may be one or a plurality of single-wafer type liquid processing chambers 230 disposed under the first buffer unit 210. That is, the first buffer unit 210 is provided to be stacked with the single-wafer processing chamber so as to immediately receive the substrate W transferred by the second transfer unit 152, and may be disposed above the single-wafer processing chamber.

The first transfer chamber 220 may be disposed between the first buffer unit 210 and the single-wafer processing chamber. The first transfer chamber 220 may include the first transfer robot 222. The first transfer robot 222 may unload the substrate W from the first buffer unit 210 and transfer the unloaded substrate W to the single-wafer processing chamber. The first transfer robot 222 may have a single-wafer transfer hand that transfers the substrate W one by one.

The single-wafer processing chamber may be disposed on one side of the first transfer chamber 220. The single-wafer processing chamber may include the single-wafer type liquid processing chamber 230 and the single-wafer type drying chamber 240.

A plurality of single-wafer processing chambers 230 may be provided. A plurality of single-wafer processing chambers 230 may be provided and stacked in a vertical direction. The single-wafer type liquid processing chamber 230 rotates the substrate W in the horizontal posture, and supply the processing liquid to the rotated substrate W to process the substrate W. In the single-wafer type liquid processing chamber 230, the substrate W may be processed one by one. The processing liquid supplied from the single-wafer type liquid processing chamber 230 may be an organic solvent. For example, the processing liquid supplied from the single-wafer type liquid processing chamber 230 may be isopropyl alcohol (IPA). The single-wafer type liquid processing chamber 230 may supply the organic solvent to the rotating substrate W, and rotate the substrate W to dry the substrate W. In contrast, the single-wafer type liquid processing chamber 230 may supply the organic solvent to the rotating substrate W, and the substrate W may be transferred to the drying chamber 240 to be described later in a state in which the substrate W is wet with the organic solvent, and the substrate W may be dried in the drying chamber 240. A detailed description of the single-wafer type liquid processing chamber 230 will be described later.

A plurality of single-wafer type drying chambers 240 may be provided. A plurality of single-wafer type drying chambers 240 may be provided and stacked in the vertical direction. In the single-wafer type drying chamber 240, the substrate W may be treated using a supercritical fluid. The single-wafer type drying chamber 240 may be a supercritical chamber for drying one substrate W in a single-wafer type. The single-wafer type drying chamber 240 may be a supercritical chamber for drying the substrate W by using a supercritical fluid. A detailed description of the single-wafer type drying chamber 240 will be described later.

The substrate W processed in the single-wafer processing chamber may be transferred to the second buffer unit 250 by the first transfer robot 222. The second buffer unit 250 may be disposed between the first transfer chamber 220 and the second transfer chamber 260. The second buffer unit 250 may be disposed between the single-wafer processing chamber and the second load port unit 270.

The second buffer unit 250 may provide a space in which the substrate W is temporarily stored or stored, similarly to the first buffer unit 210. For example, the second buffer unit 250 may temporarily store the substrate W processed in the single-wafer type liquid processing chamber 230 and/or the single-wafer type drying chamber 240, which is the single-wafer processing chamber.

The second transfer chamber 260 may be disposed between the second buffer unit 250 and the second load port unit 270. The second transfer robot 262 may be provided in the second transfer chamber 260. The second transfer robot 262 may transfer the substrate W, which has been completely treated and is accommodated in the second buffer unit 250, to the transfer container F.

The hand of the second transfer robot 262 may be a single-wafer hand that transfers the substrate W one by one. The transfer hand of the second transfer robot 262 may be provided to be movable in the first direction X, the second direction Y, and the third direction Z. In addition, the transfer hand of the second transfer robot 262 may be provided rotatably in the third direction Z as a rotation axis.

The second load port unit 270 may include at least one or more load ports. A transfer container F capable of accommodating a plurality of substrates W may be placed in a load port of the second load port unit 270. For example, the transfer container F placed on the second load port unit 270 may accommodate the substrates W that have been completely processed by the first process processing unit 100 and the second process processing unit 200. The transfer container F placed on the second load port unit 270 may accommodate only the substrates W that have been completely processed by the first process processing unit 100 and the second process processing unit 200. That is, the second load port unit 270 may perform a function of unloading the processed substrate W from the substrate treating apparatus.

The above-described second transfer robot 262 may load the processed substrate W into the container F placed in the load port of the second load port unit 270. The container F may be transferred to the outside of the substrate treating apparatus 10 by the above-described article transferring apparatus (for example, OHT).

The controller 600 may control the substrate treating apparatus 10. For example, the controller 600 may control components of the substrate processing apparatus 10. For example, the controller 600 may control the substrate processing apparatus 10 so that the substrate processing apparatus 10 may perform the process of treating the substrate W.

Further, the controller 600 may include a process controller formed of a microprocessor (computer) that executes the control of the substrate treating apparatus 10, a user interface formed of a keyboard in which an operator performs a command input operation or the like in order to manage the substrate treating apparatus 10, a display for visualizing and displaying an operation situation of the substrate treating apparatus 10, and the like, and a storage unit storing a control program for executing the process executed in the substrate treating apparatus 10 under the control of the process controller or a program, that is, a treatment recipe, for executing the process in each component according to various data and processing conditions. Further, the user interface and the storage unit may be connected to the process controller. The treatment recipe may be stored in a storage medium in the storage unit, and the storage medium may be a hard disk, and may also be a portable disk, such as a CD-ROM or a DVD, or a semiconductor memory, such as a flash memory.

Figure 6:
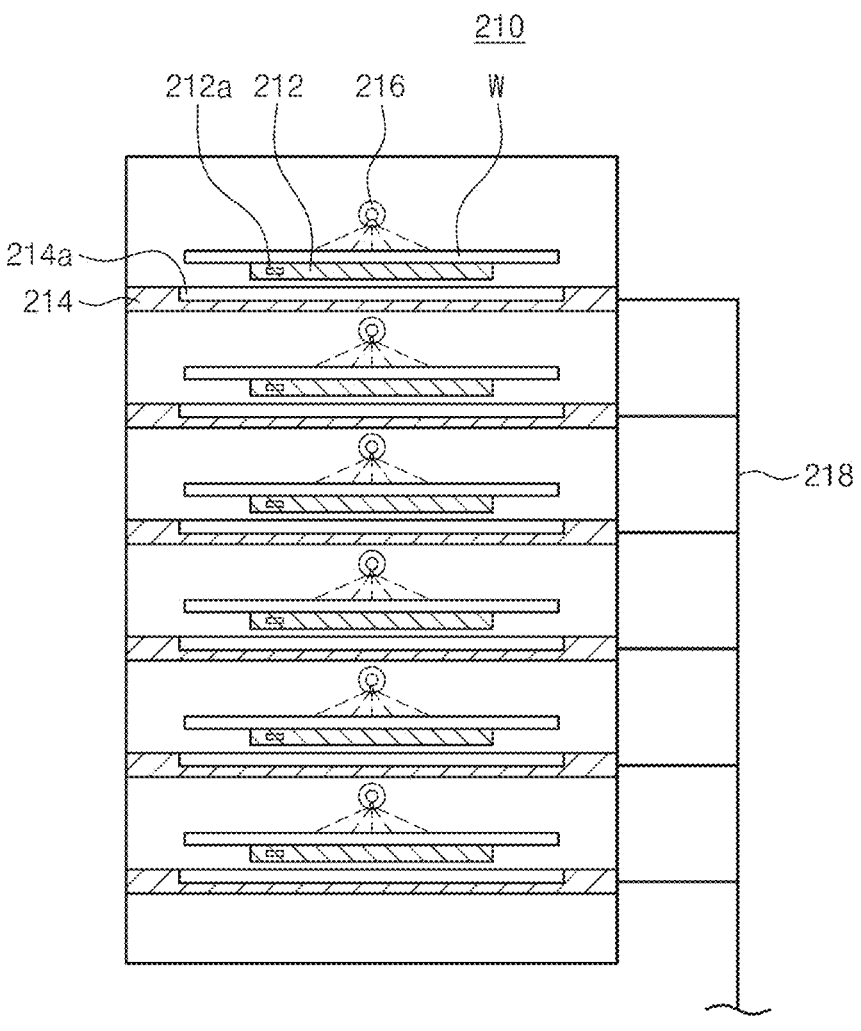
FIG. 6 is a diagram illustrating a state of a first buffer unit of FIG. 1.

FIG. 6 is a diagram illustrating a state of the first buffer unit of FIG. 1.

Referring to FIG. 6, the first buffer unit 210 may have a structure of supplying a wetting liquid to the storage device to prevent the substrates W loaded into the storage space from being dried (to maintain the wettability of the substrate W). Also, the substrates W stored in the first buffer unit 210 may be stored in respective storage spaces partitioned in the first buffer unit 210.

The first buffer unit 210 may include a support shelf 212, a drain partition wall 214, a wetting nozzle 216 (an example of the second wetting nozzle), and a drain line 218.

The support shelf 212, the drain partition wall 214, and the wetting nozzle 216 may be provided in plurality to correspond to each of the substrates W loaded into the first buffer unit 210. The support shelf 212 may support the substrate W in a space provided by the first buffer unit 210. In addition, a weight sensor 212a may be installed on the support shelf 212. The weight sensor senses the weight of the substrate W supported by the support shelf 212, and allows a user to check the amount of wetting liquid WL is supplied onto the substrate W.

The controller 600 may control the amount of wetting liquid WL per unit time injected from the wetting nozzle 216 based on the weight of the substrate W supported by the support shelf 212. The support shelf 212 may be provided to support lower surfaces of one side and the other side of the substrate W.

The wetting nozzle 216 may be configured to inject the wetting liquid in a stream or inject manner A plurality of wetting nozzles 216 may be provided. A pair of wetting nozzles 216 may inject a wetting liquid onto each substrate W. The wetting nozzle 216 may include a nozzle for supplying a chemical liquid or mist capable of maintaining the wettability of the substrate W transferred to the storage space of the first buffer unit 210. The chemical liquid or mist may supply the wetting liquid selected from isopropyl alcohol (IPA), the aforementioned chemical, and the aforementioned rinse liquid.

The drain partition wall 214 may be disposed below the support shelf 212. The drain partition wall 214 may be disposed under each of the substrates W supported on the support shelf 212. The drain partition wall 214 may serve to receive a liquid to receive liquid receiving the wetting liquid injected by the wetting nozzle 216, and may partition a space in which each substrate W is disposed. The drain partition wall 214 has a rectangular tubular shape with an open top so as to have a liquid receiving space, and the liquid receiving space of the drain partition wall 214 may be connected to the drain line 218. Accordingly, the wetting liquid injected by the wetting nozzle 216 may be discharged to the outside.

Figure 7:
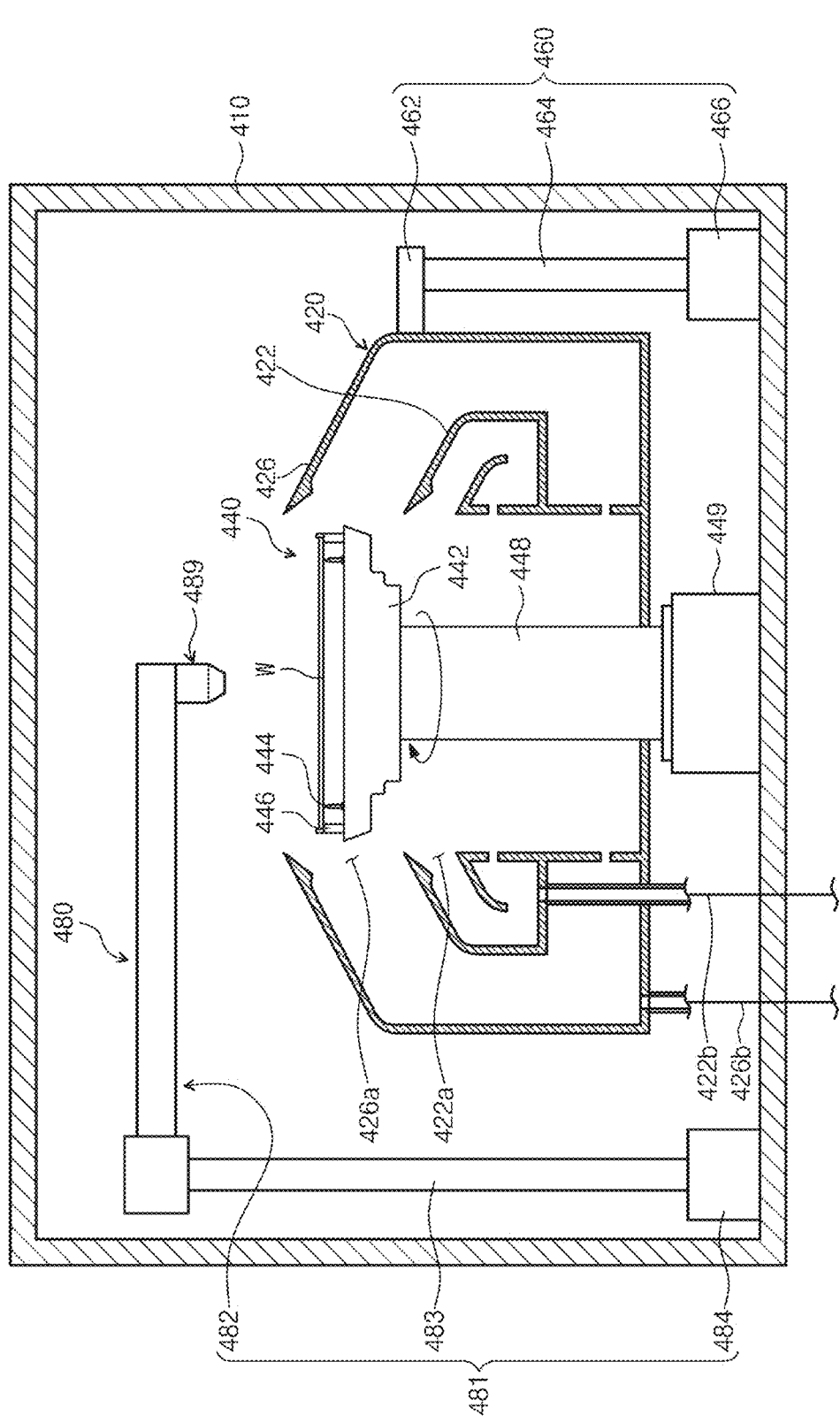
FIG. 7 is a diagram illustrating a state of a substrate treating apparatus provided in a single-wafer type liquid processing chamber of FIG. 1.

FIG. 7 is a diagram illustrating a state of the substrate treating apparatus provided in the single-wafer type liquid processing chamber of FIG. 1.

Referring to FIG. 7, the substrate processing apparatus 400 provided in the single-wafer type liquid processing chamber 230 may include a housing 410, a processing container 420, a support unit 440, an elevation unit 460, and a liquid supply unit 480.

The housing 410 has a processing space 412 therein. The housing 410 may have a cylindrical shape having a space therein. The processing container 420, the support unit 440, the lifting unit 460, and the liquid supply unit 480 may be provided in the inner space 412 of the housing 410. The housing 410 may have a rectangular shape when viewed from the front cross-section. However, the present invention is not limited thereto, and the housing 410 may be deformed into various shapes capable of having the processing space 412.

The processing container 420 has a cylindrical shape with an open top. The processing container 420 has an internal recovery container 422 and an external recovery container 426. Each of the recovery containers 422 and 426 recovers different processing liquids from among the processing liquids used in the process. The inner recovery container 422 is provided in an annular ring shape surrounding the substrate support unit 440, and the external recovery container 426 is provided in an annular ring shape surrounding the inner recovery container 426. The inner space 422a of the internal recovery container 422 and the internal recovery container 422 function as a first inlet 422a through which the processing liquid flows into the internal recovery container 422. The space 426a between the internal recovery container 422 and the external recovery container 426 functions as a second inlet 426a through which the processing liquid flows into the external recovery container 426. According to an example, each of the inlets 422a and 426a may be located at different heights. The recovery lines 422b and 426b are connected under the bottom of each of the recovery containers 422 and 426. The processing liquids introduced into each of the recovery containers 422 and 426 may be provided to an external processing liquid regeneration system (not illustrated) through the recovery lines 422b and 426b and be reused.

The support unit 440 supports the substrate W in the processing space 412. The support unit 440 supports and rotates the substrate W during the process. The support unit 440 includes a support plate 442, a support pin 444, a chuck pin 446, and rotation driving members 448 and 449.

The support plate 442 is provided in a substantially circular plate shape, and has an upper surface and a lower surface. The lower surface has a smaller diameter than that of the upper surface. That is, the support plate 442 may have a shape of a narrow upper surface and a narrow lower surface. The upper and lower surfaces are positioned so that their central axes coincide with each other. In addition, a heating means (not illustrated) may be provided on the support plate 442. The heating means provided on the support plate 442 may heat the substrate W placed on the support plate 442. The heating means may generate heat. The heat generated by the heating means may be warm or cold. Heat generated by the heating means may be transferred to the substrate W placed on the support plate 442. In addition, the heat transferred to the substrate W may heat the processing liquid supplied to the substrate W. The heating means may be a heater and/or a cooling coil. However, the present invention is not limited thereto, and the heating means may be variously modified with known devices.

A plurality of support pins 444 is provided. The support pins 444 are disposed to be spaced apart from each other at predetermined intervals on the edge of the upper surface of the support plate 442 and protrude upward from the support plate 442. The support pins 444 are arranged to have an annular ring shape as a whole by combination with each other. The support pins 444 support the rear edge of the substrate W so that the substrate W is spaced apart from the upper surface of the support plate 442 by a predetermined distance.

A plurality of chuck pins 446 is provided. The chuck pin 446 is disposed farther from the center of the support plate 442 than the support pin 444. The chuck pin 446 is provided to protrude upward from the upper surface of the support plate 442. The chuck pin 446 supports the side of the substrate W so that the substrate W is not laterally separated from the original position when the support plate 442 is rotated. The chuck pin 446 is provided to enable linear movement between the outer position and the inner position along the radial direction of the support plate 442. The outer position is a position farther from the center of the support plate 442 compared to the inner position. When the substrate W is loaded or unloaded from the support plate 442, the chuck pin 446 is positioned at the outer position, and when the process is performed on the substrate W, the chuck pin 446 is positioned at the inner position. The inner position is a position where the chuck pin 446 and the side portion of the substrate W contact each other, and the outer position is a position where the chuck pin 446 and the substrate W are spaced apart from each other.

The rotation drive members 448 and 449 rotate the support plate 442. The support plate 442 is rotatable about a magnetic center axis by the rotation driving members 448 and 449. The rotation driving members 448 and 449 include a support shaft 448 and a driving unit 449. The support shaft 448 has a cylindrical shape facing a fourth direction 16. The upper end of the support shaft 448 is fixedly coupled to the bottom surface of the support plate 442. According to the example, the support shaft 448 may be fixedly coupled to the center of the bottom surface of the support plate 442. The driving unit 449 provides driving force to rotate the support shaft 448. The support shaft 448 is rotated by the driving unit 449, and the support plate 442 is rotatable together with support shaft 448.

The lifting unit 460 linearly moves the processing container 420 up and down. As the processing container 420 moves up and down, the relative height of the processing container 420 with respect to the support plate 442 changes. The lifting unit 460 lowers the processing container 420 so that the support plate 442 protrudes above the processing container 420 when the substrate W is loaded or unloaded from the support plate 442. In addition, when the process is in progress, the height of the processing container 420 is adjusted so that the processing liquid is introduced into the predetermined recovery containers 422 and 426 according to the type of the processing liquid supplied to the substrate W. The lifting unit 460 includes a bracket 462, a moving shaft 464, and a driver 466. The bracket 462 is fixedly installed on the outer wall of the processing container 420, and a moving shaft 464, which is moved in the vertical direction by the driver 466, is fixedly coupled to the bracket 462. Optionally, the lifting unit 460 may move the support plate 442 in the vertical direction.

The liquid supply unit 480 may supply the processing liquid to the substrate W. The processing liquid may be an organic solvent, the aforementioned chemical, or a rinse liquid. The organic solvent may be isopropyl alcohol (IPA) liquid.

The liquid supply unit 480 may include a moving member 481 and a nozzle 489. The moving member 481 moves the nozzle 489 to a process position and a standby position. The process position is a position where the nozzle 489 faces the substrate W supported by the support unit 440. According to an example, the process position is a position where the processing liquid is discharged to the upper surface of the substrate W. Further, the process positon also includes a first supply position and a second supply position. The first supply position may be a position closer to the center of the substrate W than the second supply position, and the second supply position may be a position including an end of the substrate. Optionally, the second supply position may be a region adjacent to the end of the substrate. The standby position is defined as the position where the nozzle 489 is out of the process position. According to the example, the standby position may be a position at which the nozzle 489 waits before or after the process processing is completed on the substrate W.

The moving member 481 includes an arm 482, a support shaft 483, and a driver 484. The support shaft 483 is located on one side of the processing container 420. The support shaft 483 has a rod shape whose longitudinal direction is directed to the fourth direction. The support shaft 483 is provided to be rotatable by the driver 484. The support shaft 483 is provided to enable lifting and lowering movement. The arm 482 is coupled to the upper end of the support shaft 483. The arm 482 extends perpendicularly from support shaft 484. A nozzle 489 is coupled to an end of the arm 482. As the support shaft 483 is rotated, the nozzle 489 may swing along with the arm 482. The nozzle 489 may be swingably moved to the process position and the standby position. Optionally, the arm 482 may be provided to enable forward and backward movement in its longitudinal direction. A path along which the nozzle 489 moves when viewed from above may coincide with the central axis of the substrate W at the process position.

Figure 8:
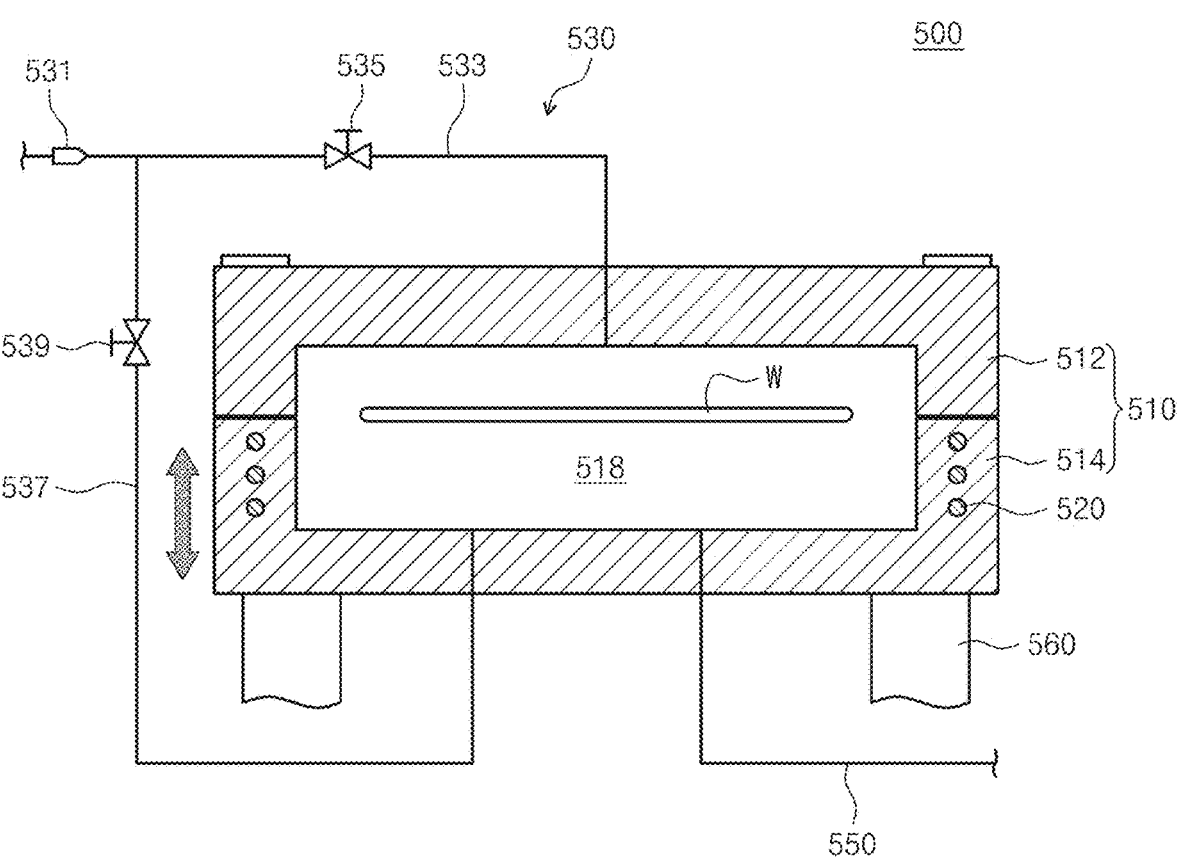
FIG. 8 is a diagram illustrating a state of a substrate treating apparatus provided in a single-wafer type drying chamber of FIG. 1.

FIG. 8 is a diagram illustrating a state of a substrate treating apparatus provided in the single-wafer type drying chamber of FIG. 1.

Referring to FIG. 8, a substrate processing apparatus 500 provided in the single-wafer type drying chamber 240 may remove the processing liquid remaining on the substrate W by using a drying fluid G in a supercritical state. The drying chamber 500 may be a supercritical chamber in which a processing liquid (for example, a rinse liquid or an organic solvent) remaining on the substrate W is removed by using the supercritical fluid. For example, the substrate processing apparatus 500 provided in the single-wafer type drying chamber 240 may perform a drying process of removing the organic solvent remaining on the substrate W by using carbon dioxide ($CO_2$) in a supercritical state.

The substrate processing apparatus 500 provided in the single-wafer type drying chamber 240 includes a body 510, a heating member 520, a fluid supply unit 530, a fluid exhaust unit 550, and a lifting member 560. The body 510 may have an internal space 518 in which the substrate W is processed. The body 510 may provide an internal space 518 in which the substrate W is processed. The body 510 may provide an internal space 518 in which the substrate W is dried by the drying fluid G in a supercritical state.

The body 510 may include an upper body 512 and a lower body 514. The upper body 512 and the lower body 514 may be combined with each other to form the inner space 518. The substrate W may be supported in the inner space 518. For example, the substrate W may be supported by a support member (not illustrated) in the internal space 518. The support member may be configured to support the lower surface of the edge region of the substrate W. Any one of the upper body 512 and the lower body 514 may be coupled to the lifting member 560 to move in the vertical direction. For example, the lower body 514 may be coupled to the lifting member 560 to move vertically by the lifting member 560.

Accordingly, the internal space 518 of the body 510 may be selectively sealed. In the above-described example, the case where the lower body 514 is coupled to the lifting member 560 to move in the vertical direction has been described as an example, but the present invention is not limited thereto. For example, the upper body 512 may be coupled to the lifting member 560 to move in the vertical direction.

The heating member 520 may heat the drying fluid G supplied to the internal space 518. The heating member 520 may increase the temperature of the internal space 518 of the body 510 to phase-change the drying fluid G supplied to the internal space 518 into a supercritical state. In addition, the heating member 520 may increase the temperature of the internal space 518 of the body 510 so that the drying fluid G in the supercritical state supplied to the internal space 518 maintains the supercritical state.

In addition, the heating member 520 may be embedded in the body 510. For example, the heating member 520 may be embedded in any one of the upper body 512 and the lower body 514. For example, the heating member 520 may be provided in the lower body 514. However, the present invention is not limited thereto, and the heating member 520 may be provided at various positions capable of increasing the temperature of the internal space 518. Also, the heating member 520 may be a heater. However, the present invention is not limited thereto, and the heating member 520 may be variously modified into a known device capable of increasing the temperature of the internal space 518.

The fluid supply unit 530 may supply the drying fluid G to the internal space 518 of the body 510. The drying fluid G supplied by the fluid supply unit 530 may include carbon dioxide ($CO_2$). The fluid supply unit 530 may include a fluid supply source 531, a first supply line 533, a first supply valve 535, a second supply line 537, and a second supply valve 539.

The fluid supply source 531 may store and/or supply the drying fluid G supplied to the internal space 518 of the body 510. The fluid supply source 531 may supply the drying fluid G to the first supply line 533 and/or the second supply line 537. For example, the first supply valve 535 may be installed in the first supply line 533. In addition, the second supply valve 539 may be installed in the second supply line 537. The first supply valve 535 and the second supply valve 539 may be on/off valves. Depending on the on/off of the first supply valve 535 and the second supply valve 539, the drying fluid G may selectively flow in the first supply line 533 or the second supply line 537.

In the above-described example, the case where the first supply line 533 and the second supply line 537 are connected to one fluid supply source 531 has been described as an example, but the present invention is not limited thereto. For example, a plurality of fluid supply sources 531 may be provided, the first supply line 533 may be connected to any one of the plurality of fluid supply sources 531, and the second supply line 537 may also be connected to another one of the fluid supply sources 531.

Also, the first supply line 533 may be an upper supply line for supplying drying gas from an upper portion of the internal space 518 of the body 510. For example, the first supply line 533 may supply the drying gas to the internal space 518 of the body 510 in a direction from top to bottom. For example, the first supply line 533 may be connected to the upper body 512. In addition, the second supply line 537 may be a lower supply line for supplying drying gas in the lower portion of the internal space 518 of the body 510. For example, the second supply line 537 may supply the drying gas to the inner space 518 of the body 510 in a direction from bottom to top. For example, the second supply line 537 may be connected to the lower body 514.

The fluid exhaust unit 550 may exhaust the drying fluid G from the internal space 518 of the body 510.

Figure 9:
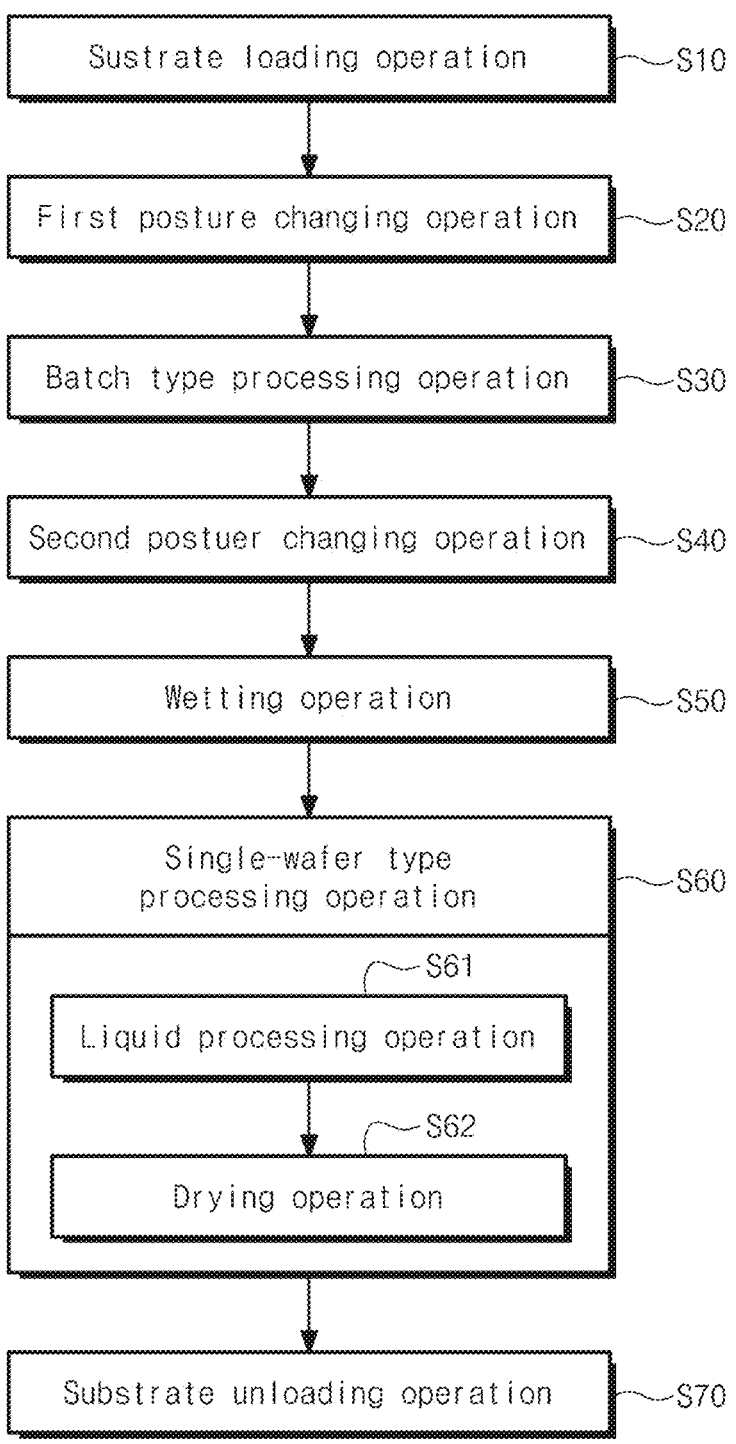
FIG. 9 is a flowchart illustrating a substrate treating method according to an exemplary embodiment of the present invention.

FIG. 9 is a flowchart illustrating a substrate treating method according to an exemplary embodiment of the present invention.

Referring to FIG. 9, the substrate processing method according to the exemplary embodiment of the present invention may include a substrate loading operation S10, a first posture changing operation S20, a batch type processing operation S30, and a second posture changing operation S40, a wetting operation S50, a single-wafer processing operation S60, and a substrate unloading operation S70.

In the substrate loading operation S10, a substrate W in an untreated state, which is required to be treated, may be loaded into the substrate processing apparatus 10. In the substrate loading operation S10, the transfer container F may be placed on the first load port unit 110.

The substrate W accommodated in the transfer container F may be unloaded by the index robot 122 and transferred to the storage container C.

In the first posture changing operation S20, the posture of the substrate W may be changed from a horizontal posture to a vertical posture. In the first posture changing operation S20, the posture of the substrate W may be changed by rotating the storage container C about the first direction X by the posture changing unit 124. The posture changing unit 124 may have a rotation shaft capable of rotating the storage container C about the first direction X. In the first posture changing operation S20, the postures of the plurality of substrates W may be changed at once.

The substrate W of which the posture has been changed to the vertical posture may be transferred to the first batch type processing unit 141 by the first transfer unit 132.

In the batch type processing operation S30, liquid processing may be performed on the plurality of substrates W of the vertical posture. In the batch type processing operation S30, the substrates W are transferred to at least one or more batch processing tanks 141-B1 to 143-B2 to perform liquid processing on the substrates W. The batch type processing operation S30 may be performed in such a way that the substrate W is pre-processed in the first batch type processing unit 141 and post-processed in the second batch type processing unit 142 or the third batch type processing unit 143.

For example, the substrate W transferred to the first batch type processing unit 141 may be liquid processed in the first-1 batch processing tank 141-B1 and/or the first-2 batch processing tank 141-B2. The substrate W that has been liquid-processed in the first-1 batch processing tank 141-B1 and/or the first-2 batch processing tank 141-B2 may be transferred to and processed in any one processing unit selected between the second batch type processing unit 142 and the third batch type processing unit 143. In the first-1 batch processing tank 141-B1, the substrate W may be processed with a chemical (an example of a first chemical liquid), such as DSP, and in the first-2 batch processing tank 141-B2, the substrate W may be treated with a chemical (an example of a second chemical liquid), such as DHF.

For example, when the substrate W has been transferred to the second batch type processing unit 142, the substrate W is first processed by a chemical (an example of a third chemical liquid) containing phosphoric acid in the second-1 batch processing tank 142-B1, and thereafter, the substrate W may be rinsed by a rinse liquid containing water in the second-2 batch processing tank 142-B2.

The rinsed substrates W may be transferred to the posture change processing tank 151 by the second transfer unit 134.

The second posture changing operation S40 may be performed by the posture changing unit 150. The second posture changing operation S40 may include a grip operation of gripping the substrate W and a rotation operation of changing the posture of the substrate W. In the second posture changing operation S40, the posture change of the substrate W may be performed one by one.

Figure 10:
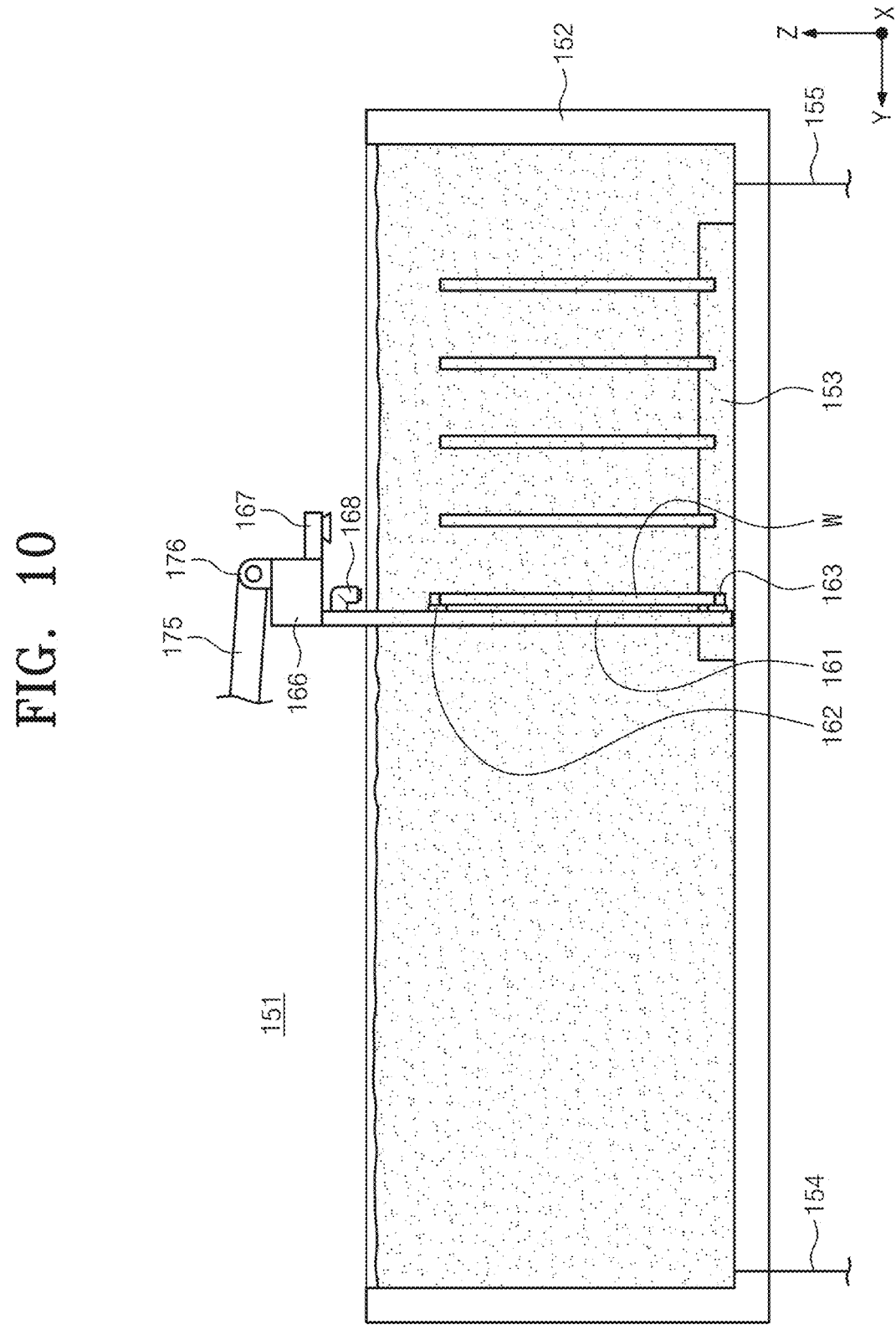

For example, as illustrated in FIG. 10, in the gripping operation of the second posture changing operation S40, the hand 156-H may access any one substrate W among the substrates W supported by the support member 153 in the vertical posture. The hand 156-H may be moved so that the substrate W may be positioned between the first guide part 162 and the second guide part 163. When the substrate W is positioned between the first guide part 162 and the second guide part 163, the chucking body 165 may move to the chucking position to grip the substrate W.

When the hand 156-H grips the substrate W, the substrate W may be moved upwardly so that the substrate W may be separated from the support recess formed in the support member 153.

Figure 11:
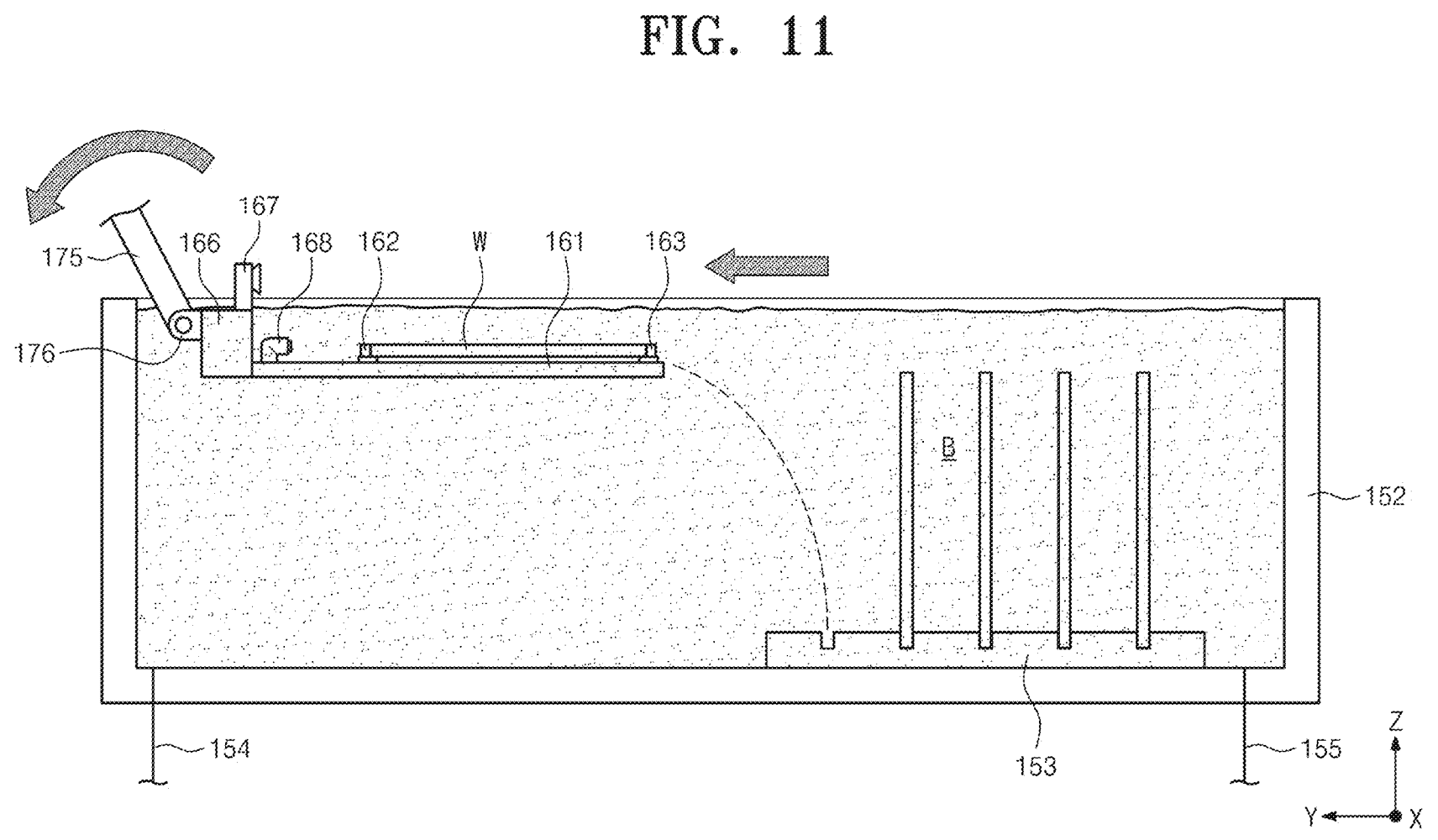

Thereafter, as illustrated in FIG. 11, in the rotation operation in the second posture changing operation S40, the position of the substrate W may be changed by linearly moving the substrate W in one direction (for example, the horizontal direction) while rotating the substrate W based on one axis on which the fastening body 166 is rotated. That is, in the rotation operation, as the hand 156-H of the posture changing robot 156 rotates about one axis, the hand 156-H may move linearly along the horizontal direction. In this case, the posture of the substrate may be changed from the vertical posture to the horizontal posture in the state where one end of the substrate W is immersed in the processing liquid L while drawing a virtual curve (for example, a cut parabola). In addition, the substrate W may be rotated in a direction in which one end of the substrate W is away from the hand 156-H.

In addition, a difference between a time point at which the rotation of the substrate W ends and a time point at which the linear movement of the substrate W ends may be equal to or less than a set time. For example, the two time points may be the same time point. That is, at the same time that the linear movement of the substrate W ends, the rotation of the substrate W by the rotation member 166 may be all terminated.

Also, the vision member 167 may not be immerged in the processing liquid L while the substrate W is gripped and the substrate W is rotated. That is, the vision member 167 may be installed at a position that is not immersed in the processing liquid L stored in the posture change processing tank 151. Accordingly, a problem in which the vision member 167 is damaged by the processing liquid L may be minimized.

When the posture of the substrate W is changed while the substrate W is immersed in the processing liquid L, the substrate W may be damaged by resistance by the processing liquid L. However, as in the present invention, when the posture of the substrate W is changed while the substrate W linearly moves and rotates in the state where the substrate W is immersed in the processing liquid L, transmission of resistance by the processing liquid L to the substrate W may be suppressed as much as possible. In addition, when the posture of the substrate W is changed by moving the substrate W away from the processing liquid L (that is, in a state where the substrate W is exposed to air), a water mark may be generated on the substrate W due to failure to maintaining the wettability of the substrate W, and in the present invention, this problem may be minimized by changing the posture of the substrate W in the state in which the substrate W is immersed in the processing liquid L.

After the second posture changing operation S40 is performed, the wetting operation S50 may be performed. The wetting operation S50 may be performed between the second posture changing operation S40 and the single-wafer processing operation S60.

The wetting operation S50 may be performed by the posture changing robot 156 and/or the first buffer unit 210. In the wetting operation S50, natural drying of the substrate W may be prevented by injecting the wetting liquid to the substrate W exposed to the outside from the processing liquid L. The wetting liquid may be the same type of liquid as the processing liquid L stored in the posture change processing tank 151 described above. Alternatively, the wetting liquid may be a liquid different from the above-described processing liquid L.

Figure 12:
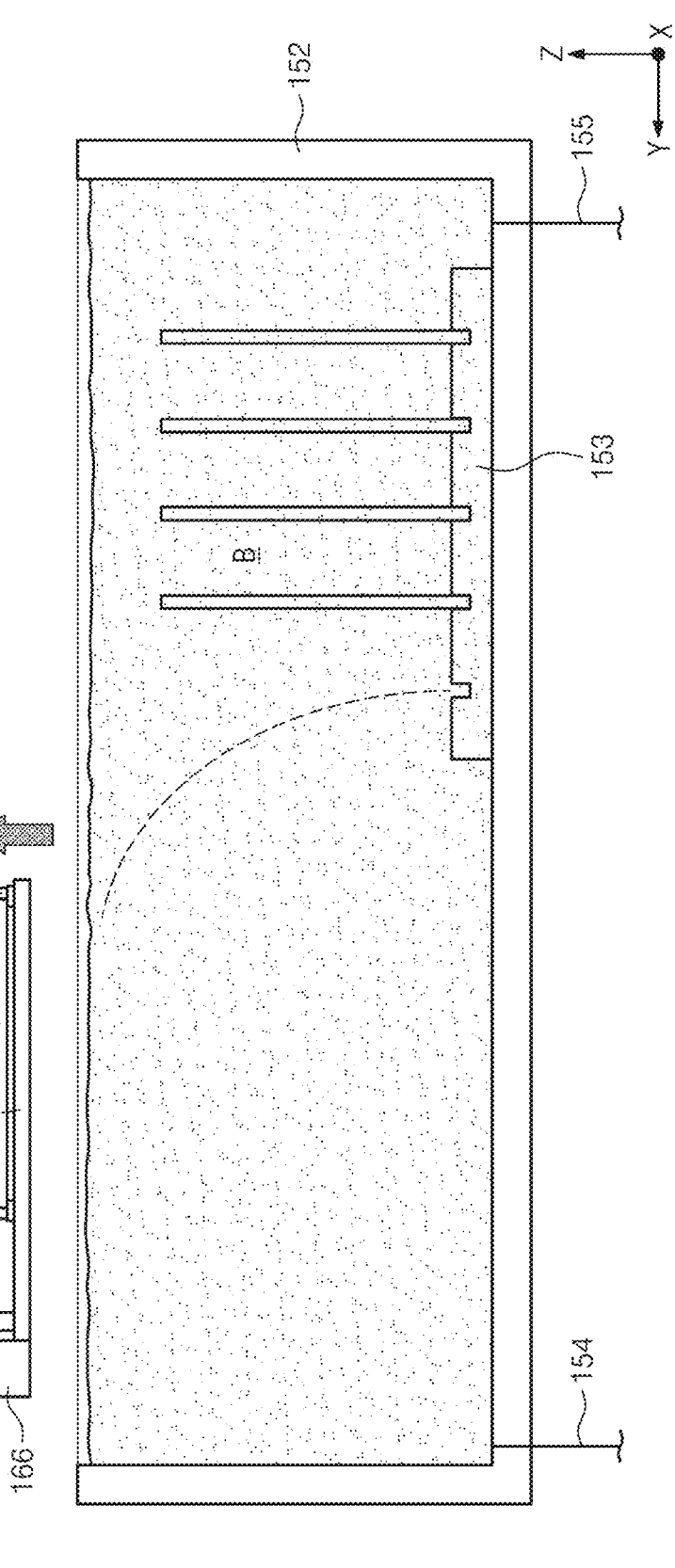
FIG. 12 is a diagram illustrating a state of the posture changing robot performing a wetting operation of FIG. 9.
Figure 13:
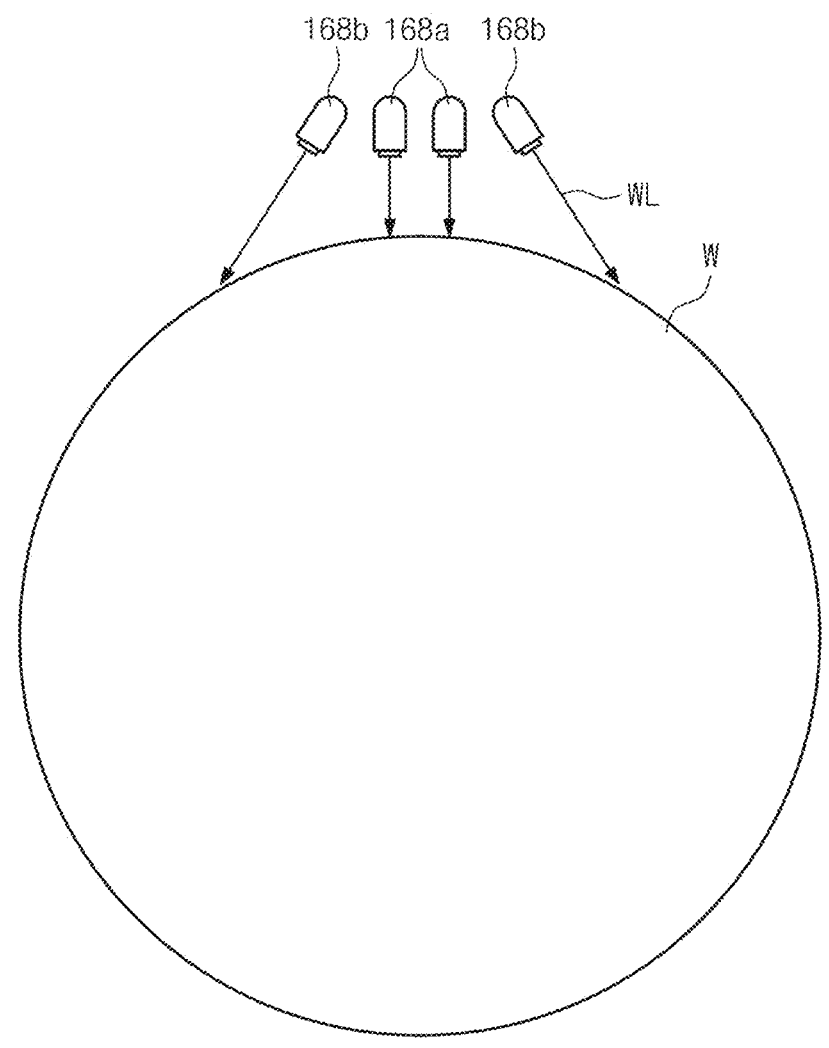
FIG. 13 is a diagram illustrating the state where a liquid supply member supplies a wetting liquid in the wetting operation of FIG. 9 viewed from above.
Figure 14:
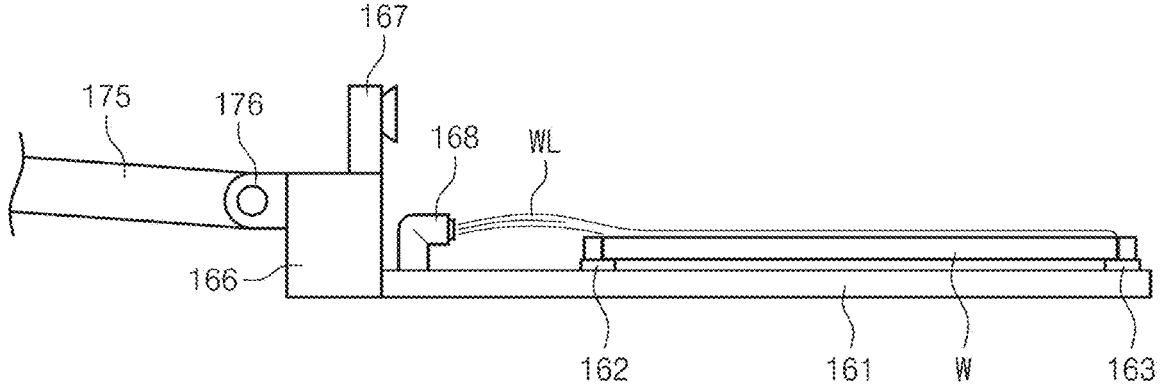
FIG. 14 is a diagram illustrating the state where the liquid supply member supplies the wetting liquid in the wetting operation of FIG. 9 viewed from the side.

For example, as illustrated in FIG. 12, the posture change of the substrate W is completed, and the posture changing robot 156 may move the substrate W in the upper direction so as to move the substrate W away from the processing liquid L accommodated in the posture change processing tank 152. When the substrate W moves away from the processing liquid L, the liquid supply member 168 may supply the wetting liquid WL. In this case, the wetting liquid WL may be supplied to the first region and the second region that are the edge regions of the substrate W as illustrated in FIGS. 13 and 14. The wetting liquid WL supplied to the edge region of the substrate W may form a liquid film on the upper surface of the substrate W while flowing along the upper surface of the substrate W. As such, when the wetting liquid WL flows along the edge region of the substrate W to form the liquid film, the splashing phenomenon of the wetting liquid WL is suppressed as much as possible, and the substrate W may be treated more efficiently.

Also, the wetting operation S50 may also be performed in the first buffer unit 210 as described above. The substrate W on which the second posture changing operation S40 has been performed may be transferred to the first buffer unit 210 by the posture changing robot 156. In the wetting operation S30, when the substrate W is loaded into the first buffer unit 210, the wetting nozzle 216 of the first buffer unit 210 may inject the wetting liquid onto the substrate W.

As the wetting operation S30 is performed, it is possible to minimize the natural drying of the substrate W before the substrate W is loaded into the single-wafer processing chamber.

In the single-wafer processing operation S60, processing may be performed on the single substrate W of the horizontal posture. The single-wafer processing operation S60 may include a liquid processing operation S61 and a drying operation S62.

In the liquid processing operation S61, the substrate W may be liquid-processed in a single-wafer type. The liquid processing operation S61 may be performed in the single-wafer type liquid processing chamber 230 when the substrate W temporarily stored in the first buffer unit 210 is transferred to the single-wafer type liquid processing chamber 230. In the liquid processing operation S40, an organic solvent, such as IPA, may be supplied onto the substrate W.

In the drying operation S62, the substrate W may be dried in a single-wafer type. The drying operation S62 may be performed in the drying chamber 240 when the liquid-processed substrate W is transferred to the drying chamber 240 in the liquid processing operation S61. In the drying operation S50, an organic solvent, wetting liquid, or processing liquid L remaining on the substrate may be removed by supplying a processing fluid (for example, carbon dioxide in a supercritical state) in a supercritical state to the substrate W.

In some cases, the drying operation S50 is not performed in the drying chamber 240, but the substrate W may be dried by rotating the substrate W at a high speed in the single-wafer type liquid processing chamber 230. (so-called spin drying).

In the substrate unloading operation S70 performed after the single-wafer processing operation S60, the substrate W on which the single-wafer processing operation S60 has been performed is transferred to the second buffer unit 250, and thereafter, the transfer container F placed on the second load port unit 270 may be transferred by the second transfer robot 262 of the second transfer chamber 260, and the transfer container F placed on the second load port unit 270 may be gripped by a transfer device, such as an OHT, and unloaded from the substrate processing apparatus 10.

As described above, the substrate processing apparatus 10 according to the exemplary embodiment of the present invention may include both the batch type processing unit 140 and the single-wafer type liquid processing chamber 230. Accordingly, the present invention may have all the advantages of the batch liquid processing method and the single-wafer type liquid processing method.

For example, the batch type processing unit 140 is capable of processing the plurality of substrates W at once, so that the mass productivity of the treatment of the substrate W is very good, and the processing uniformity between the substrates W is very high. In addition, when the pattern formed on the substrate W has a high aspect ratio, a portion that has not been processed by the batch type processing unit 140 (for example, a portion that has not been etched) may be supplemented by supplying a chemical, a rinse liquid, and the like in the single-wafer type liquid processing chamber 230. In addition, the substrate (W, for example, a wafer) wetted by the organic solvent supplied from the single-wafer type liquid processing chamber 230 or the first buffer unit 210 may be transferred to the drying chamber 240 for drying the substrate W by supplying a supercritical fluid. The supercritical fluid has high penetrating power with respect to the space between the patterns formed on the substrate W, and may dry the substrate W without rotating the substrate W, thereby minimizing the occurrence of the pattern leaning phenomenon described above. In addition, the substrate processing apparatus 10 of the present invention is capable of performing all of the single-wafer type liquid processing method, the batch liquid processing method, and the method of drying the substrate W by using the supercritical fluid, so that it is possible to improve defects caused by particles, dripping, and flow. In addition, since the number of substrates W that can be processed by the batch type processing unit 140 is relatively large, a large number of liquid processing chambers is not required, so that there is an advantage in that the footprint of the substrate processing apparatus 10 is reduced. In addition, the substrate processing apparatus 10 of the present invention further includes the single-wafer type liquid processing chamber 230 as described above, so that it is possible to solve the problem of abnormal growth of $SiO_2$ in the pattern on the substrate W, which may occur when the substrate W is processed by using only the batch type processing unit 140.

In addition, as in the substrate processing apparatus 10 according to the exemplary embodiment of the present invention, when both the batch type processing unit 140 and the single-wafer type liquid processing chamber 230 are provided, it is essential to change the posture of the substrate W from the vertical posture to the horizontal posture. Accordingly, the substrate processing apparatus 10 according to the exemplary embodiment of the present invention includes the posture changing robot 156 to change the posture of the substrate W from the vertical posture to the horizontal posture. At this time, in order to maintain the wettability of the substrate W as much as possible (otherwise, the substrate W may be dried and a water mark may be generated), the posture of the substrate W is changed in a state in which the substrate W is immersed in the processing liquid L.

Figure 15:
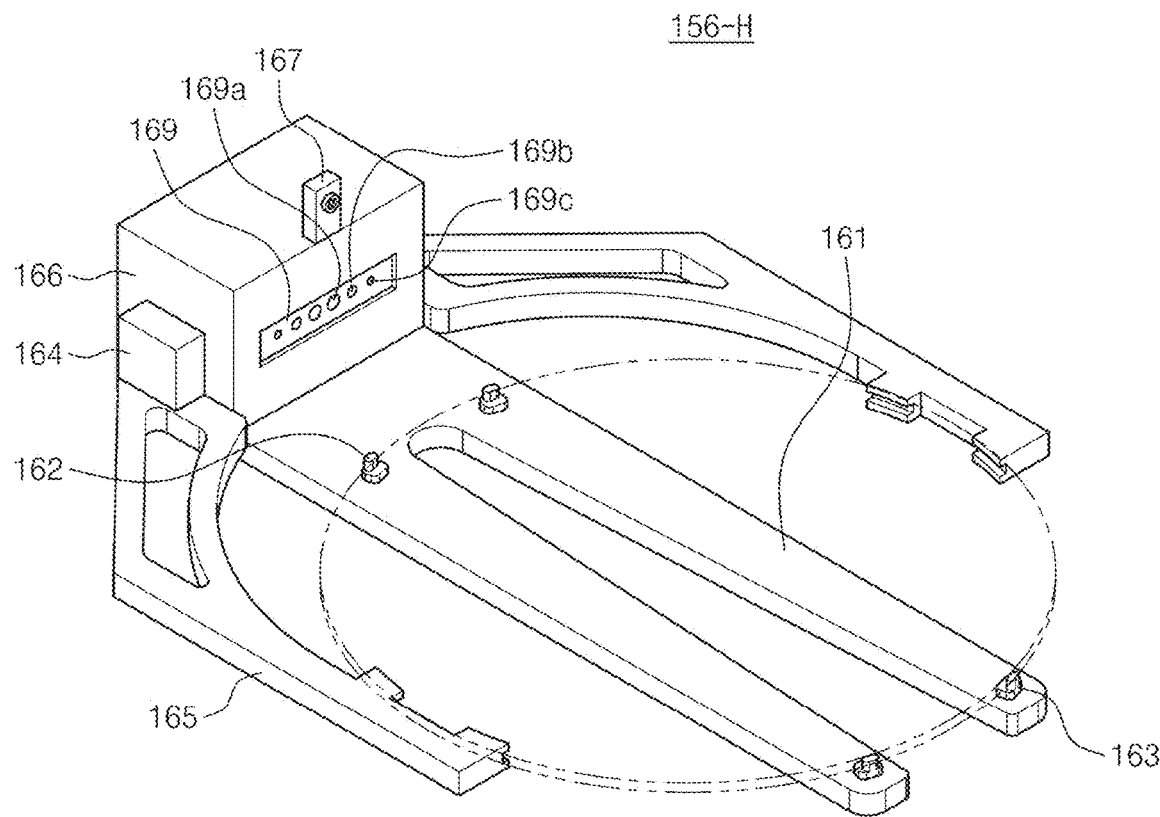
FIG. 15 is a diagram illustrating a state of a hand according to another exemplary embodiment of the present invention.
Figure 16:
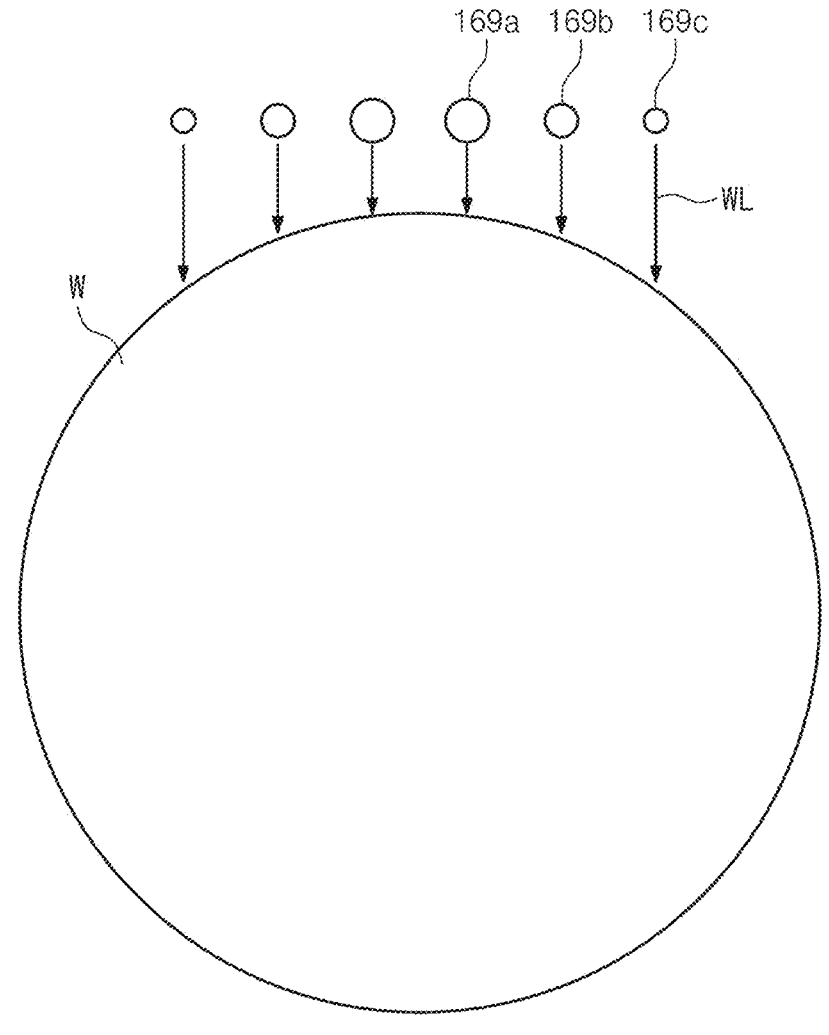
FIG. 16 is a diagram illustrating a state where a liquid supply member of FIG. 15 supplies a wetting liquid to a substrate viewed from above.

In the above-described example, the case where the liquid supply member 168 is installed on the support body 161 has been described as an example, but the present invention is not limited thereto. For example, as illustrated in FIG. 15, the liquid supply member 169 may be installed on the fastening body 166. The liquid supply member 169 may be a supply pipe in which a first nozzle 169a, a second nozzle 168b, and a third nozzle 168c are formed. The first nozzle 169a, the second nozzle 168b, and the third nozzle 168c may inject the wetting liquid WL toward the substrate W in a downwardly inclined direction. At least one of the first nozzle 169a, the second nozzle 168b, and the third nozzle 168c may be formed, respectively. For example, a plurality of first nozzles 169a, second nozzles 168b, and third nozzles 168c may be formed. The first nozzles 169a may be disposed between the second nozzles 169b, and the second nozzles 169b may be disposed between the third nozzles 169c. The first nozzles 169a may be disposed relatively inside, and the third nozzles 169c may be disposed relatively outside. Also, as illustrated in FIG. 16, diameters of the injection holes of the first nozzle 169a, the second nozzle 168b, and the third nozzle 168c may be different from each other. The diameter of the injection hole of the first nozzle 169a may be greater than that of the second nozzle 168b, and the diameter of the injection hole of the second nozzle 169b may be greater than that of the third nozzle 168c. Also, the supply flow rates of the wetting liquid WL per unit time delivered to the first nozzle 169a, the second nozzle 168b, and the third nozzle 168c may be the same. Accordingly, among the injection distances of the wetting liquids WL supplied from the first nozzle 169a, the second nozzle 168b, and the third nozzle 168c, the injection distance of the first nozzle 169a is the shortest and the injection distance of the third nozzle 169c is the longest. In addition, the first nozzle 169a, the second nozzle 168b, and the third nozzle 168c may supply the wetting liquid WL to the edge region of the substrate W.

Figure 17:
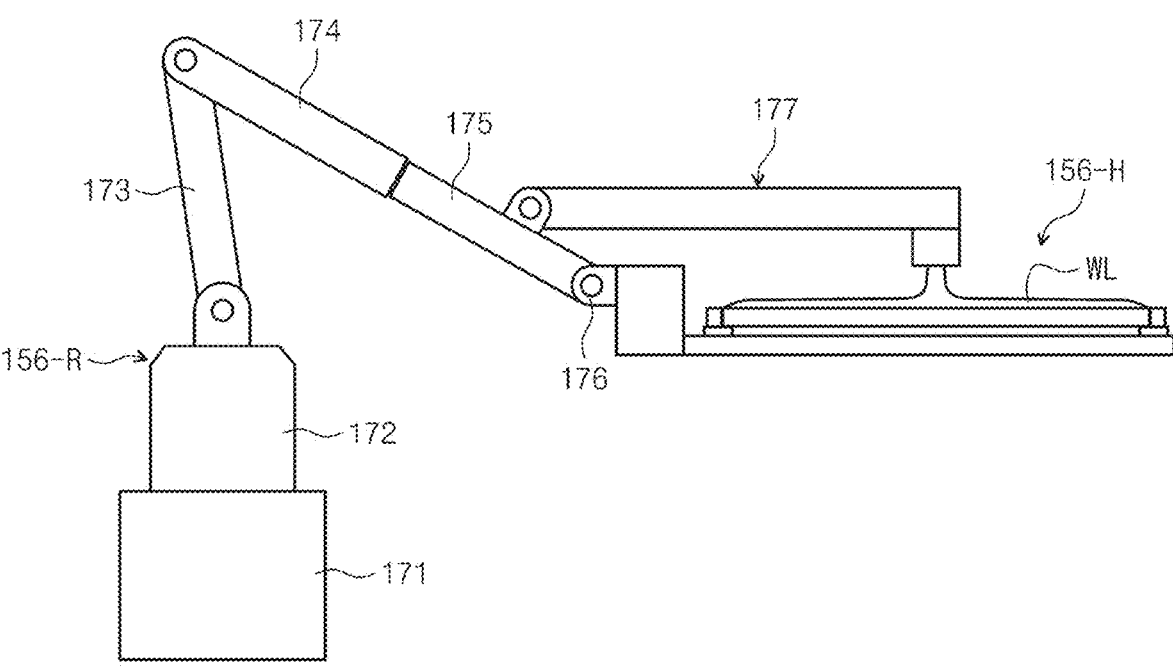
FIG. 17 is a diagram illustrating a state of a posture changing robot according to another exemplary embodiment of the present invention.

In the above-described example, the case where the posture changing robot 156 supplies the wetting liquid WL to the edge region of the substrate W has been described as an example, but the present invention is not limited thereto. For example, as illustrated in FIG. 17, the liquid supply member 177 may be coupled to the third arm 175. And, the liquid supply member 177 may be configured to be provided rotatably in a direction parallel to the direction in which the fourth arm 176 rotates as a rotation axis, and to supply the wetting liquid WL to the central region of the substrate W placed on the hand 156-H.

Figure 18:
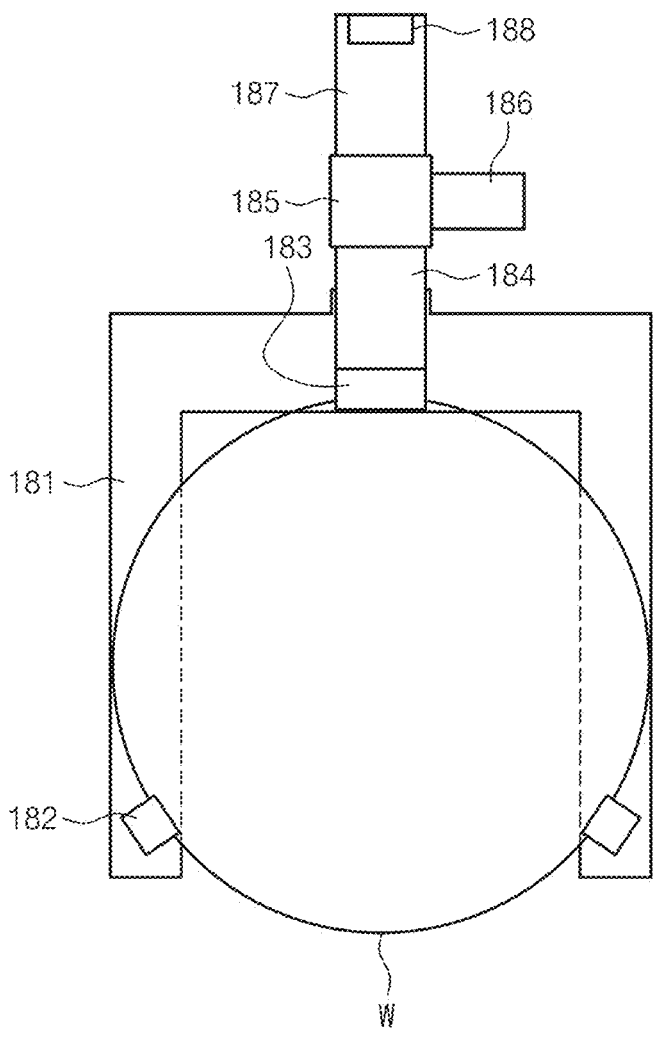
FIG. 18 is a diagram illustrating a hand according to another exemplary embodiment of the present invention viewed from above.
Figure 19:
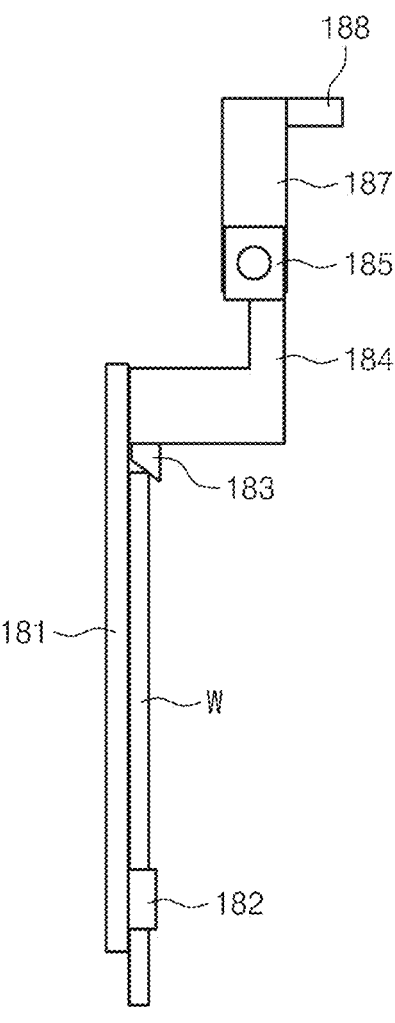
FIG. 19 is a diagram illustrating the hand of FIG. 18 viewed from the side.

FIG. 18 is a diagram illustrating a hand according to another exemplary embodiment of the present invention viewed from above, and FIG. 19 is a diagram illustrating the hand of FIG. 18 viewed from the side.

Referring to FIGS. 18 and 19, a hand 156-H1 according to another exemplary embodiment that the posture changing robot 156 may have may include a support body 181, a guide part 182, a chucking body 183, a driving member 184, a rotation member 185, a rotation motor 186, a connection body 187, and a vision member 188.

The support body 181 may have a finger shape. The guide part 182 may be provided at the distal end of the support body 181. The guide part 182 may support the side of the substrate W, and the support body 181 may support the lower surface of the substrate W.

The chucking body 183 may move in one direction by the driving member 184. The chucking body 183 may be moved between a chucking position in which the substrate W is chucked by the driving member 184 and a standby position in which the substrate W is not chucked. The rotation member 185 may rotate the support body 181 and the substrate W about one axis, and the rotation motor 186 may transmit driving force for rotating the rotation member 185. The connecting body 187 may be connected to a joint portion 156-R of the posture changing robot 156. The vision member 188 may perform the same or similar function as that of the vision member 187 described above. Also, similarly to the vision member 167, the vision member 188 may also be installed at a position not immersed in the processing liquid L stored in the posture change processing tank 151 when the posture of the substrate W is changed.

Figure 20:
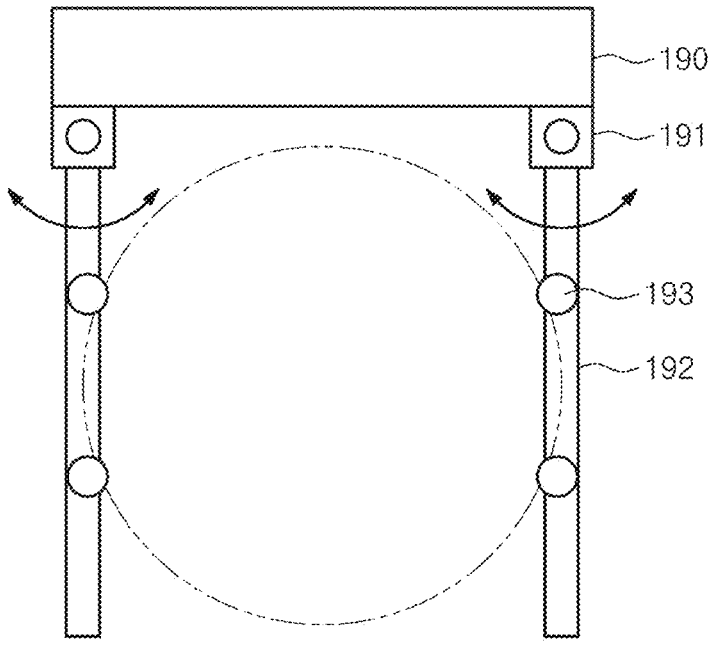
FIG. 20 is a diagram illustrating a hand according to another exemplary embodiment of the present invention viewed from above.
Figure 21:
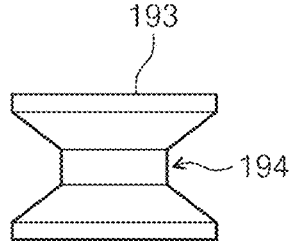
FIG. 21 is a diagram illustrating a gripper of FIG. 20 viewed from the side.

FIG. 20 is a diagram illustrating a hand according to another exemplary embodiment of the present invention viewed from above and FIG. 21 is a diagram illustrating a gripper of FIG. 20 viewed from the side. Referring to FIGS. 20 and 21, a hand 156-H2 of the posture changing robot 156 according to another exemplary embodiment of the present invention may include a fastening body 190, a rotating member 191, a chucking body 192, and a gripper 193. The fastening body 190 may be coupled to a joint portion 156-R of the posture changing robot 156. The rotating member 191 may rotate the chucking body 192. A plurality of grippers 193 may be installed on the chucking body 192. A grip groove 194 for gripping the side of the substrate W may be formed in the gripper 193.

In the above example, the case where the substrate processing apparatus 10 according to the exemplary embodiment of the present invention includes both the single-wafer type liquid processing chamber 230 and the drying chamber 240 has been described as an example, but the present invention is not limited thereto. For example, the substrate processing apparatus 10 may include only one of the single-wafer type liquid processing chamber 230 and the drying chamber 240.

In the above example, the case where the substrate W unloaded from the batch type processing unit 140 is transferred to the single-wafer type liquid processing chamber 230, and after the substrate W is processed in the single-wafer type liquid processing chamber 230, the substrate W is transferred to the drying chamber 240 has been described as an example, but the present invention is not limited thereto. For example, when the particle level is good, the substrate W may be directly transferred from the batch liquid processing chamber 140 to the drying chamber 240.

The foregoing detailed description illustrates the present invention. Further, the above content illustrates and describes the exemplary embodiment of the present invention, and the present invention can be used in various other combinations, modifications, and environments. That is, the foregoing content may be modified or corrected within the scope of the concept of the invention disclosed in the present specification, the scope equivalent to that of the disclosure, and/or the scope of the skill or knowledge in the art. The foregoing exemplary embodiment describes the best state for implementing the technical spirit of the present invention, and various changes required in specific application fields and uses of the present invention are possible. Accordingly, the detailed description of the invention above is not intended to limit the invention to the disclosed exemplary embodiment. Further, the accompanying claims should be construed to include other exemplary embodiments as well.

What is claimed is:

1. An apparatus for treating a substrate, the apparatus comprising:
   a processing tank having an accommodation space in which a processing liquid is accommodated;
   a support member configured to support at least one substrate in the accommodation space in a vertical posture; and
   a posture changing robot configured to change a posture of the substrate in a state of being immersed in the processing liquid from the vertical posture to a horizontal posture,
   wherein the posture changing robot includes
   a hand configured to grip the substrate, and
   an arm configured to move the hand.

2. The apparatus of claim 1, further comprising:
   a controller configured to control the posture changing robot to move the substrate along one direction while rotating the substrate about one axis when the posture of the substrate is changed.

3. The apparatus of claim 2, wherein the controller is further configured to control the posture changing robot so that the hand moves linearly along the one direction while holding the substrate and rotating about the one axis when the posture of the substrate is changed.

4. The apparatus of claim 2, wherein the controller is further configured to control the posture changing robot so that a difference between a first time point at which a rotation of the substrate ends and a second time point at which a movement of the substrate along the one direction ends is equal to or less than a set time.

5. The apparatus of claim 4, wherein the controller is further configured to control the posture changing robot so that the first time point at which the rotation of the substrate ends and a third time point at which a position change of the substrate along the one direction ends are same as each other.

6. The apparatus of claim 2, wherein the hand includes:
   a support body configured to support the substrate; and
   a chucking body configured to move between a chucking position for chucking the substrate and a standby position farther from the substrate than the chucking position.

7. The apparatus of claim 6, wherein the hand further includes a fastening body configured to fasten the support body and the chucking body to the arm.

8. The apparatus of claim 7, wherein the hand further includes a vision member configured to photograph the substrate supported by the support body.

9. The apparatus of claim 2, wherein the arm is an articulated arm composed of at least two axes.

10. The apparatus of claim 2, further comprising:
    a buffer unit configured to temporarily store the substrate,
    wherein the controller is further configured to control the posture changing robot to transfer the substrate of which the posture is changed from the vertical posture to the horizontal posture to the buffer unit.

11. The apparatus of claim 1, wherein the posture changing robot further includes a wetting nozzle configured to supply a wetting liquid for maintaining wettability of the substrate placed on the hand.

12. The apparatus of claim 11, wherein the wetting liquid is a liquid of a same type as the processing liquid.

13. An apparatus for treating a substrate, the apparatus comprising:
   a first process processing unit configured to process the substrate in a batch manner; and
   a second process processing unit configured to process the substrate in a single-wafer type,
   wherein the first process processing unit includes
      a posture change processing tank having an accommodation space in which a liquid is accommodated,
      a support member configured to support at least one substrate in the accommodation space in a vertical posture, and
      a posture changing robot configured to change a posture of the substrate in a state of being immersed in the liquid from the vertical posture to a horizontal posture, wherein the posture changing robot includes a hand and an arm that moves the hand.

14. The apparatus of claim 13, further comprising:
   a controller configured to control the posture changing robot so that the posture changing robot completes a posture change of the substrate and transfers the substrate of which the posture has been changed to the second process processing unit.

15. The apparatus of claim 14, wherein
   the second process processing unit includes a buffer unit configured to temporarily store the substrate of which the posture has been changed, and
   the controller is further configured to control the posture changing robot so that the posture changing robot completes the posture change of the substrate and transfers the substrate of which the posture has been changed to the buffer unit.

16. The apparatus of claim 13, wherein the accommodation space has:
   a support region in which the support member supports the substrate; and
   a posture change region in which the posture changing robot changes the posture of the substrate.

17. The apparatus of claim 16, wherein the posture changing robot is adjacent to the posture change region between the support region and the posture change region.

18. The apparatus of claim 13, wherein
   the first process processing unit further includes a batch processing tank configured to process a plurality of substrates with a processing liquid, and
   when viewed from above, a first width in one direction among widths of the batch processing tank is smaller than a second width in the one direction of the posture change processing tank.

19. The apparatus of claim 18, further comprising:
   a plurality of batch processing tanks including the batch processing tank, and
   the first process processing unit further includes
      a first transfer unit configured to process an unprocessed substrate to a selected one of the plurality of batch processing tanks,
      a second transfer unit configured to transfer the substrate between a selected one of the plurality of batch processing tanks and the posture change processing tank, and
      a batch transfer unit configured to transfer the substrate between the plurality of batch processing tanks.

20. An apparatus for treating a substrate, the apparatus comprising:
   a first process processing unit configured to process the substrate in a batch manner;
   a second process processing unit configured to process the substrate in a single-wafer type; and
   a controller, wherein
   the first process processing unit includes
      a batch processing tank configured to process substrates in a vertical posture,
      a posture change processing tank configured to change a posture of the substrate in the vertical posture to a horizontal posture, wherein the posture change processing tank has an accommodation space in which a liquid is accommodated, and a support member configured to support the substrate in the vertical posture is in the accommodation space, and
      a posture changing robot configured to change the posture of the substrate in a state of being immersed in the liquid from the vertical posture to the horizontal posture, the posture changing robot including a hand and an arm for moving the hand,
   the second process processing unit includes
      a buffer unit configured to provide a space for temporarily storing the substrate,
      a single-wafer type liquid processing chamber configured to liquid-process the substrate by supplying a processing liquid to the substrate in rotation,
      a single-wafer type drying chamber configured to dry the substrate by supplying a supercritical fluid to the substrate, and
      a transfer robot configured to transfer the substrate between the buffer unit and the single-wafer type liquid processing chamber, or between the buffer unit and the single-wafer type drying chamber, and
   the controller is configured to control the posture changing robot so that the substrate moves in a horizontal direction while rotating about one axis in the state of being immersed in the liquid accommodated in the accommodation space when the posture of the substrate is changed, and control the posture changing robot so that the posture changing robot completes a change of the posture of the substrate and then transfers the substrate to the buffer unit.

* * * * *